(12) United States Patent
Han et al.

(10) Patent No.: US 11,594,582 B2
(45) Date of Patent: Feb. 28, 2023

(54) DISPLAY DEVICE AND MOBILE TERMINAL DEVICE INCLUDING THE SAME

(71) Applicant: LG Display Co., Ltd., Seoul (KR)

(72) Inventors: Man Hyeop Han, Paju-si (KR); Bo Gun Seo, Paju-si (KR); Seung Taek Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/353,412

(22) Filed: Jun. 21, 2021

(65) Prior Publication Data

US 2021/0408140 A1 Dec. 30, 2021

(30) Foreign Application Priority Data

Jun. 24, 2020 (KR) .......................... 10-2020-0077108

(51) Int. Cl.
*G06K 9/00* (2022.01)
*H01L 27/32* (2006.01)
(Continued)

(52) U.S. Cl.
CPC ........ *H01L 27/323* (2013.01); *G06V 40/1318* (2022.01); *G09G 3/2003* (2013.01);
(Continued)

(58) Field of Classification Search
CPC ............... H01L 27/323; H01L 27/3218; H01L 27/3258; H01L 51/5209; H01L 51/5225; H01L 27/3225; H01L 27/3234; G06V 40/1318; G06V 40/13; G09G 3/2003; G09G 3/3258; G09G 3/3291; G09G 2300/0452; G09G 2320/0276

See application file for complete search history.

(56) References Cited

U.S. PATENT DOCUMENTS 10,154,166 B2 12/2018 Chang et al.
10,469,694 B2 11/2019 Chang et al.
(Continued)

FOREIGN PATENT DOCUMENTS

| CN | 108538206 A | 9/2018 |
|---|---|---|
| CN | 110970466 A | 4/2020 |
| TW | 202022586 A | 6/2020 |

OTHER PUBLICATIONS

European Patent Office, Extended European Search Report and Opinion, EP Patent Application No. 21181604.6, dated Nov. 18, 2021, nine pages.

(Continued)

*Primary Examiner* — Abdul-Samad A Adediran
(74) *Attorney, Agent, or Firm* — Fenwick & West LLP

(57) ABSTRACT

Disclosed herein are a display device and a mobile terminal device including the same, wherein the display device includes a display panel including a display area in which a first plurality of pixels are disposed, and a sensing area in which a plurality of photosensors and a second plurality of pixels are disposed. The first plurality of pixels of the display area and the second plurality of pixels of the sensing area may emit light by receiving a data voltage of an input image in a display mode. At least some of the second plurality of pixels in the sensing area may emit light in a fingerprint recognition mode.

15 Claims, 36 Drawing Sheets

(51) Int. Cl.
  *G06V 40/13* (2022.01)
  *G09G 3/20* (2006.01)
  *G09G 3/3258* (2016.01)
  *G09G 3/3291* (2016.01)
  *H01L 51/52* (2006.01)

(52) U.S. Cl.
  CPC ......... *G09G 3/3258* (2013.01); *G09G 3/3291* (2013.01); *H01L 27/3218* (2013.01); *H01L 27/3258* (2013.01); *H01L 51/5209* (2013.01); *H01L 51/5225* (2013.01); *G09G 2300/0452* (2013.01); *G09G 2320/0276* (2013.01)

(56) References Cited

U.S. PATENT DOCUMENTS

| | | | |
|---|---|---|---|
| 10,573,235 B2 | 2/2020 | Cui et al. | |
| 11,049,901 B2 | 6/2021 | Ryu et al. | |
| 2017/0078513 A1 | 3/2017 | Chang et al. | |
| 2018/0285619 A1* | 10/2018 | Kim | G06V 40/13 |
| 2018/0299982 A1 | 10/2018 | Liu et al. | |
| 2019/0149687 A1 | 5/2019 | Chang et al. | |
| 2019/0244562 A1 | 8/2019 | Zhu et al. | |
| 2019/0362672 A1 | 11/2019 | Cui et al. | |
| 2020/0091253 A1* | 3/2020 | Liu | H01L 27/3225 |
| 2020/0105828 A1 | 4/2020 | Ryu et al. | |
| 2020/0119108 A1* | 4/2020 | Park | H01L 27/3234 |
| 2020/0394381 A1* | 12/2020 | Ryu | G06V 40/13 |

OTHER PUBLICATIONS

Kamada, T. et al., "OLED display incorporating organic photodiodes for fingerprint imaging," Journal of the Society for Information Display, vol. 27, No. 6, Apr. 15, 2019, pp. 361-371.

First Office Action, Taiwan Intellectual Property Office Patent Application No. 110122831, dated May 5, 2022, 10 pages.

* cited by examiner (Pixel OFF)

EXAMPLE 2 OF FINGERPRINT RECOGNITION
TURN GREEN/BLUE SUB-PIXELS ON,
EFFECTIVE FOR FINGERPRINT RECOGNITION
SA

CPIX

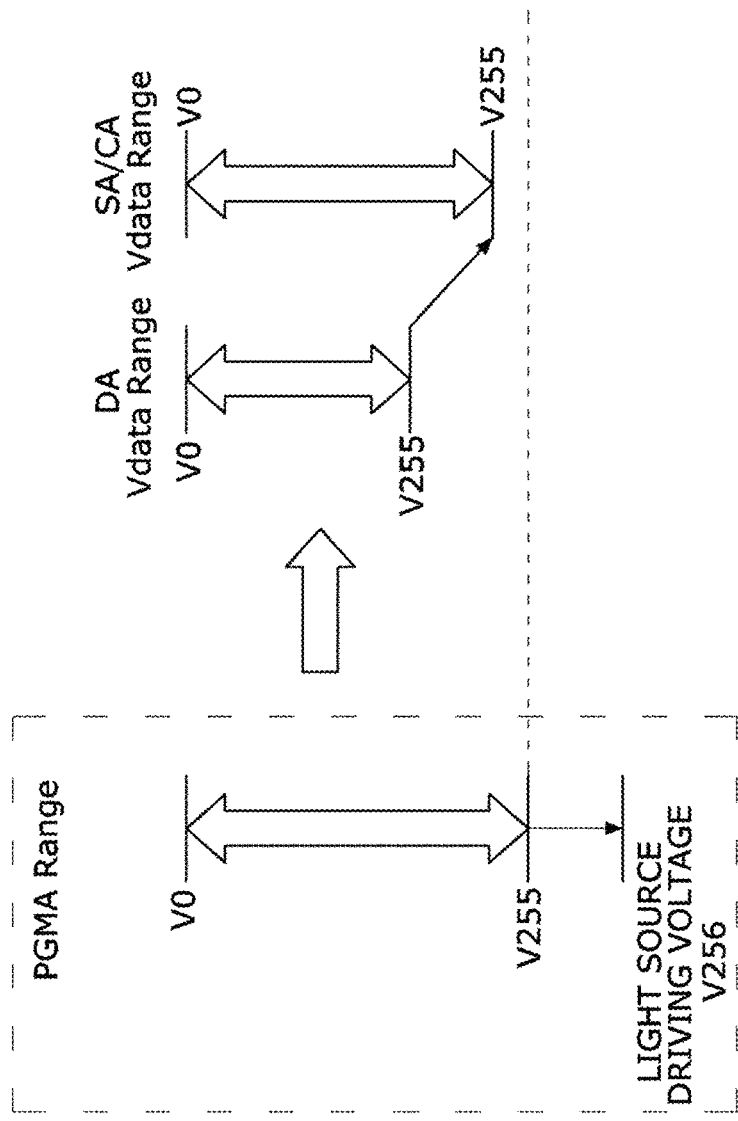

DISPLAY DEVICE AND MOBILE TERMINAL DEVICE INCLUDING THE SAME

CROSS-REFERENCE TO RELATED APPLICATION

This application claims priority to and the benefit of Republic of Korea Patent Application No. 10-2020-0077108, filed on Jun. 24, 2020, the disclosure of which is hereby incorporated by reference in its entirety.

BACKGROUND

1. Technical Field

The present disclosure relates to a display device with a fingerprint sensor and a mobile terminal device including the same.

2. Discussion of Related Art

Electroluminescent display devices are roughly classified into inorganic light emitting display devices and organic light emitting display devices according to materials of light emitting layers. Active matrix type organic light emitting display devices include organic light-emitting diodes (hereinafter referred to as "OLEDs"), which emit light by themselves and have advantages in that response speeds are fast, and light emission efficiencies, brightness, and viewing angles are high. In the organic light-emitting display devices, the OLEDs are formed in pixels. Since the organic light-emitting display devices have fast response speeds and are excellent in light emission efficiency, brightness, and viewing angle, as well as exhibiting a black gradation in a full black color, the organic light-emitting display devices are excellent in a contrast ratio and color reproducibility.

Recently, the organic light-emitting display devices are being widely applied to display devices of mobile terminal devices. A biometric recognition technique is applied to user authentication of the mobile terminal device. As an example of the biometric recognition technique, since fingerprint sensors provide security and convenience in user authentication processes, the fingerprint sensors are widely applied to smart phones. The fingerprint sensors applied to the smartphones sense fingerprints of users when screen unlocking or user authentication is required.

Due to the fingerprint sensors, there are many restrictions on screen designs of the smartphones. As an example, the existing button-type fingerprint sensor is an obstacle which makes it difficult to enlarge a screen size and implement a full-screen display due to being disposed below a screen of a display device. In order to implement the full-screen display, a fingerprint recognition on display (FOD) technique has been developed to place a fingerprint sensor below the screen of the display device and sense a fingerprint on the screen. Since a camera should be located under the screen in order to implement an FOD, a thickness of the display device is increased, and a process of assembling a display panel with the camera is added so that there is a problem in which yield is decreased and a manufacturing cost is increased.

SUMMARY

An object of the present disclosure is to solve the above-mentioned needs and/or problems.

The present disclosure is directed to a display device, for which a process of assembling a display panel with a fingerprint sensor module is not necessary and is capable of improving image quality of a fingerprint sensing area and fingerprint sensing performance, and a mobile terminal device including the same.

It should be noted that objects of the present disclosure are not limited to the above-described objects, and other objects of the present disclosure will be apparent to those skilled in the art from the following descriptions.

According to an aspect of the present disclosure, there is provided a display device including a display panel including a display area in which a plurality of pixels are disposed, and a sensing area in which a plurality of photosensors and a plurality of pixels are disposed. The pixels of the display area and the pixels of the sensing area may emit light by receiving a data voltage of an input image in a display mode. At least some of the pixels in the sensing area may emit light in a fingerprint recognition mode.

According to another aspect of the present disclosure, there is provided a mobile terminal device including a display panel including a display area in which a plurality of pixels are disposed and a sensing area in which a plurality of photosensors and a plurality of pixels are disposed; and a fingerprint recognition processor configured to generate fingerprint pattern image data from a signal which is photoelectrically converted by a photosensor in the sensing area, wherein the pixels of the display area and the pixels of the sensing area emit light by receiving a data voltage of an input image in a display mode, and at least some of the pixels in the sensing area emit light in a fingerprint recognition mode.

BRIEF DESCRIPTION OF THE DRAWINGS

The above and other objects, features and advantages of the present disclosure will become more apparent to those skilled in the art by describing exemplary embodiments thereof in detail with reference to the accompanying drawings, in which:

FIG. 27 is a diagram illustrating data voltages applied to the pixels in the display area and data voltages applied to the pixels in the sensing area according to one embodiment of the present disclosure.

DETAILED DESCRIPTION

Figure 1:
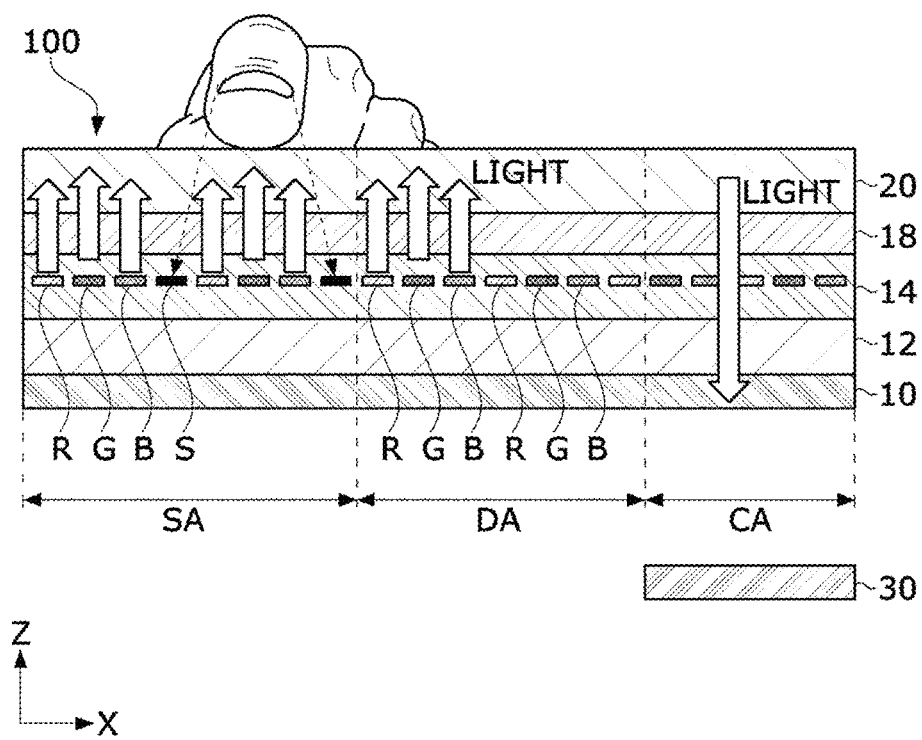
FIGS. 1 and 2 are schematic diagrams illustrating a display device according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present invention complete and allow those skilled in the art to completely comprehend the scope of the present invention. The present invention is only defined within the scope of the accompanying claims.

The shapes, sizes, ratios, angles, numbers, and the like illustrated in the accompanying drawings for describing the embodiments of the present invention are merely examples, and the present invention is not limited thereto. Like reference numerals generally denote like elements throughout the present specification. Further, in describing the present invention, detailed descriptions of known related technologies may be omitted to avoid unnecessarily obscuring the subject matter of the present invention.

The terms such as "comprising," "including," and "having," used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The same reference numerals may refer to substantially the same elements throughout the present disclosure.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings.

Referring to FIG. 1, a screen of a display panel 100 includes a display area DA, a first sensing area SA, and a second sensing area CA. Each of the display area DA, the first sensing area SA, and the second sensing area CA includes a pixel array in which pixels are disposed.

In order to secure transmittance, the number of pixels per unit area of each of the first and second sensing areas SA and CA, that is, pixels per inch (PPI), is lower than a PPI of the display area DA.

An input image is reproduced on the first and second sensing areas SA and CA and the display area DA. In order to implement a color of an image, each of the pixels includes sub-pixels having different colors. The sub-pixels include a red sub-pixel (hereinafter referred to as an "R sub-pixel"), a green sub-pixel (hereinafter referred to as a "G sub-pixel"), and a blue sub-pixel (hereinafter referred to as a "B sub-pixel"). Although not shown in the drawing, each of the pixels P may further include a white sub-pixel (hereinafter referred to as a "W sub-pixel"). Each of the sub-pixels includes a pixel circuit and a light-emitting element OLED. In the following drawings, R denotes an R sub-pixel, G denotes a G sub-pixel, and B denotes a B sub-pixel.

The first sensing area SA includes photosensors S and pixels R, G, and B. The photosensors S of the first sensing area SA may be formed coplanar with the pixels R, G, and B without overlapping the pixels R, G, and B. The pixels of the first sensing area SA in which pixel data is written in the display mode is displayed as the input image. The photosensors S of the first sensing area SA are driven in a fingerprint recognition mode and convert light, which is reflected from a fingerprint of a user in contact with a cover glass 20, into a current to sense a fingerprint pattern. Outputs of the photosensors S are converted into fingerprint pattern image data used for fingerprint authentication of the user.

At least one among the pixels of the first sensing area SA may be driven as a light source in the fingerprint recognition mode.

The second sensing area CA includes pixels and a camera module disposed below a screen of the display panel 100. The pixels of the second sensing area CA in which pixel data is written in the display mode is displayed as the input image. The camera module captures an external image in a capturing mode and outputs photo data or video image data. A lens 30 of the camera module faces the second sensing area CA. External light is incident on the lens 30 of the camera module through the second sensing area CA, and the lens 30 condenses the external light in an image sensor which is omitted from the drawing.

The PPI of each of the first and second sensing areas SA and CA is lower than the PPI of the display area DA. The PPI of the first sensing area SA may be equal to the PPI of the second sensing area CA. Due to pixels removed from the first and second sensing areas SA and CA, an image quality compensation algorithm may be applied to compensate for brightness and color coordinates of the pixels in the first and second sensing areas SA and CA.

According to the present disclosure, since an image is displayed in the display area DA, the first sensing area SA, and the second sensing area CA, a full-screen display may be implemented. According to the present disclosure, since a separate fingerprint sensor module is not bonded to the display panel 100, there is no reduction in yield caused due to a process of assembling the display panel 100 with the camera, and a manufacturing cost may be decreased.

Due to a low PPI, the first sensing area SA may have an insufficient light source. As the PPI of the first sensing area SA becomes smaller, a sensing light source is needed. According to the present disclosure, a display pixel may be used as a light source in the fingerprint recognition mode, and a separate sensing light source may be additionally disposed in the first sensing area SA.

Figure 2:
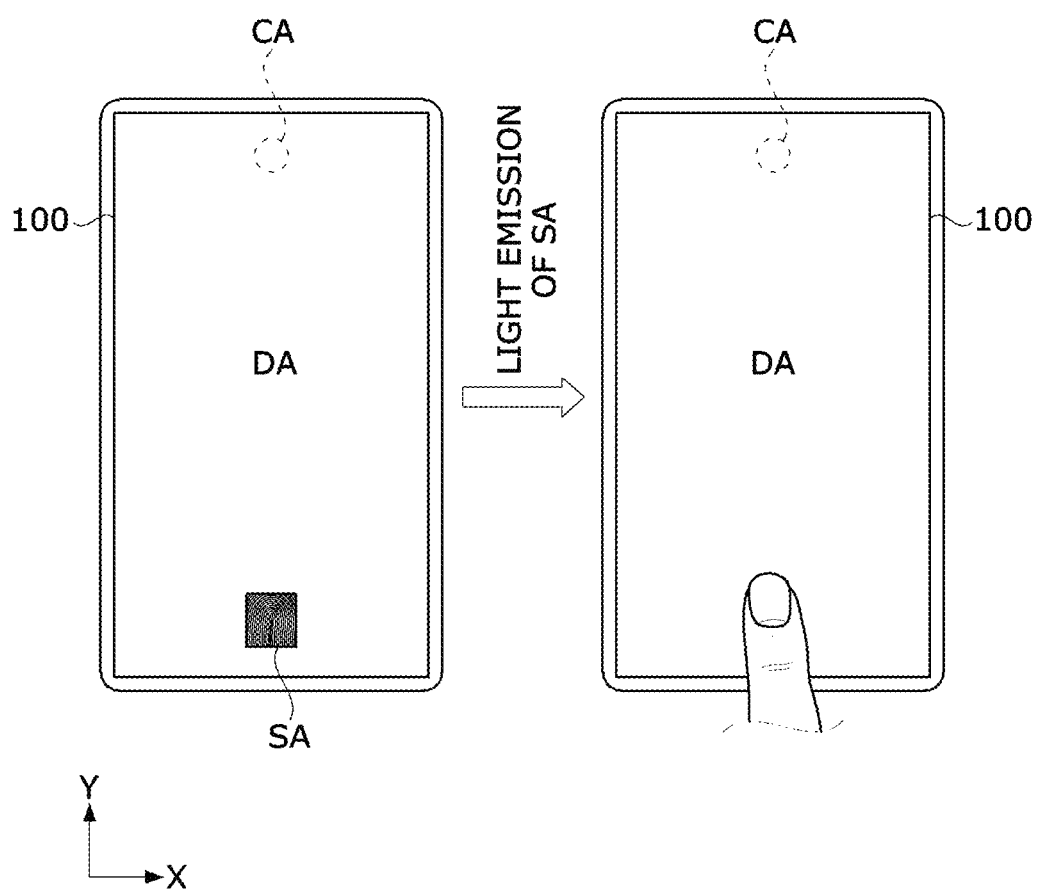

As shown in FIGS. 1 and 2, the display panel 100 has a width in an X-axis direction, a length in a Y-axis direction, and a thickness in a Z-axis direction. The display panel 100 includes a circuit layer 12 disposed on a substrate 10, and a light-emitting element and a sensor layer 14 disposed on the circuit layer 12. A polarizing plate 18 may be disposed on the light-emitting element and the sensor layer 14, and the cover glass 20 may be disposed on the polarizing plate 18.

The circuit layer 12 may include pixel circuits connected to data lines, gate lines, and power lines, gate drivers connected to the gate lines, and photosensor drive circuits. The circuit layer 12 may include circuit elements such as a transistor implemented as a thin film transistor (TFT) and a capacitor.

The light-emitting element and the sensor layer 14 may include a light-emitting element which is driven by the pixel circuit. The light-emitting element may be implemented as an organic light emitting diode (OLED). The OLED includes an organic compound layer formed between an anode and a cathode. The organic compound layer may include a hole injection layer HIL, a hole transport layer HTL, a light emission layer EML, an electron transport layer ETL, and an electron injection layer EIL, but the present disclosure is not limited thereto. When a voltage is applied to the anode and the cathode of the OLED, holes passing through the hole transport layer HTL and electrons passing through the electron transport layer ETL move to the light emission layer EML to form excitons so that visible light is emitted from the light emission layer EML. The light-emitting element and the sensor layer 14 may be disposed on pixels which selectively transmit red, green, and blue wavelengths and may further include a color filter array.

The light-emitting element and the sensor layer 14 include a photosensor S formed on the same layer as the light-emitting elements. The photosensor S may be implemented as an organic/inorganic photodiode of a PN junction diode structure.

The light-emitting element and the sensor layer 14 may be covered with a protective film, and the protective film may be covered with an encapsulation layer. The protective film and the encapsulation layer may have a structure in which an organic layer and an inorganic layer are alternately stacked. The inorganic layer blocks infiltration of moisture or oxygen. The organic layer planarizes a surface of the inorganic layer. When the organic layer and the inorganic layer are stacked in multiple layers, a movement path of moisture or oxygen becomes longer than a movement path of a single layer so that the infiltration of moisture/oxygen affecting the light-emitting element and the sensor layer 14 may be effectively blocked.

The polarizing plate 18 may be bonded to the encapsulation layer. The polarizing plate 18 improves outdoor visibility of the display device. The polarizing plate 18 reduces light reflected from a surface of the display panel 100 and blocks light reflected from a metal of the circuit layer 12, thereby improving brightness of the pixels. The polarizing plate 18 may be implemented as a polarizing plate or a circular polarizing plate to which a linear polarizing plate and a phase delay film are bonded.

Figure 3:
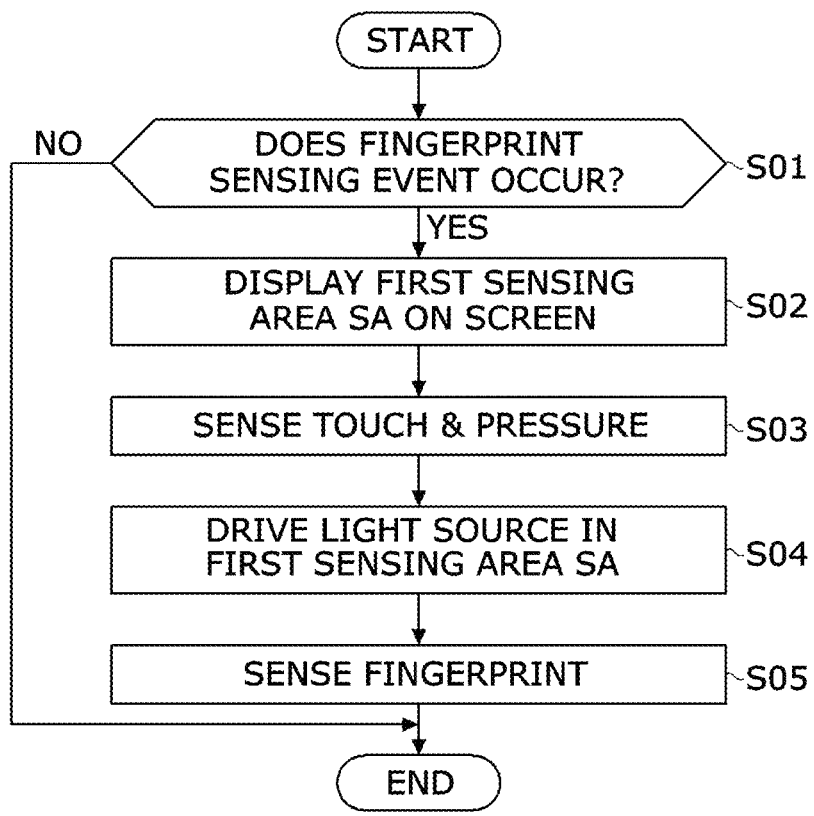
FIG. 3 is a flowchart illustrating a method of driving a first sensing area in a fingerprint recognition mode according to an embodiment of the present disclosure.

FIG. 3 is a flowchart illustrating a method of driving the first sensing area SA in the fingerprint recognition mode according to an embodiment of the present disclosure. Referring to FIG. 3, when a fingerprint sensing event occurs, the first sensing area SA starts to be operated in the fingerprint recognition mode. A host system omitted from the drawings is connected to the display device, generates a fingerprint sensing event in an application which requires user authentication, receives fingerprint pattern image data from the display device, and processes fingerprint authentication.

When the fingerprint recognition mode starts, the display device may display the first sensing area SA to guide a fingerprint sensing position (S01 and S02). In response to an output signal from a touch sensor or a pressure sensor, the host system detects a finger placed in the first sensing area SA (S03). In response to a command from the host system, the display device drives the light sources and the photosensors S in the first sensing area SA to sense a fingerprint (S04 and S05). The photosensors S photoelectrically convert light reflected from the fingerprint of the user in the fingerprint recognition mode. The fingerprint recognition processor omitted from the drawings converts outputs of the photosensors S into digital data to generate fingerprint pattern image data and transmits the fingerprint pattern image data to the host system. The host system performs fingerprint authentication by comparing the fingerprint pattern image data with preset fingerprint pattern data of the user.

Figure 4:
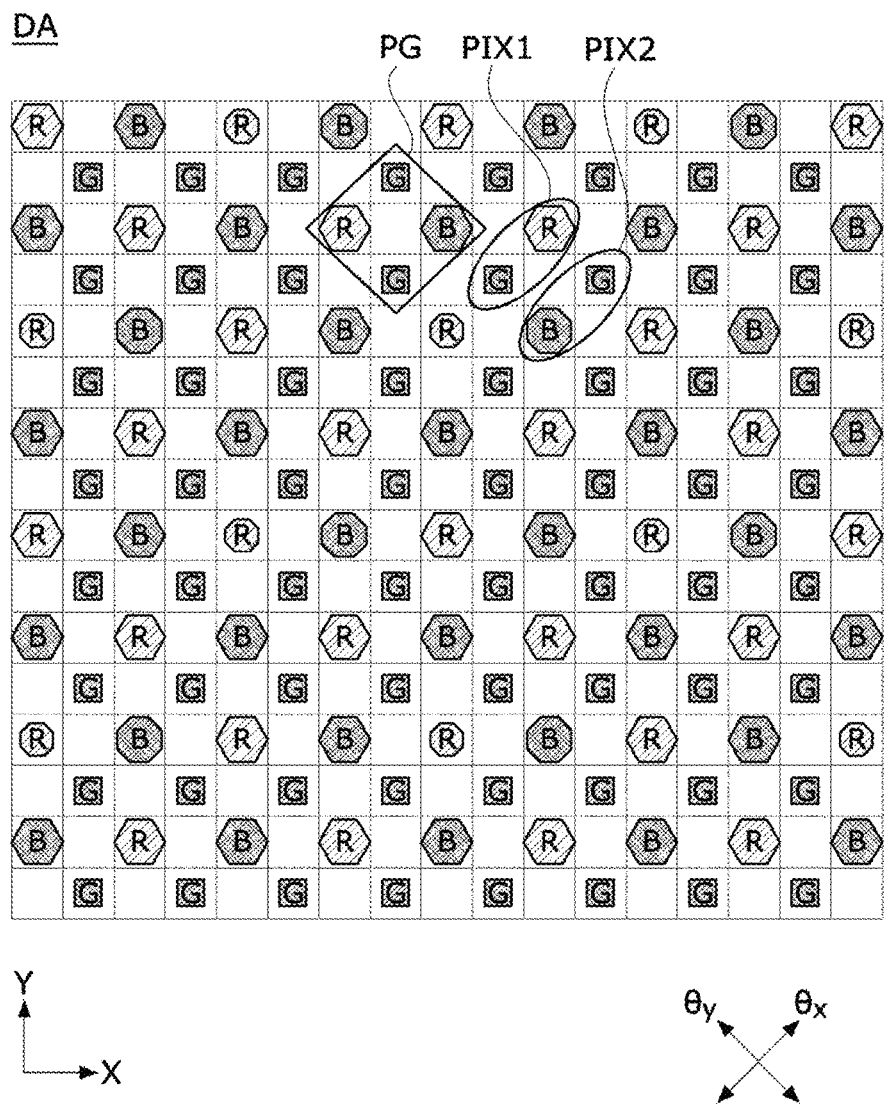
FIG. 4 is a diagram illustrating an example of a pixel arrangement in a display area according to one embodiment of the present disclosure.
Figure 5:
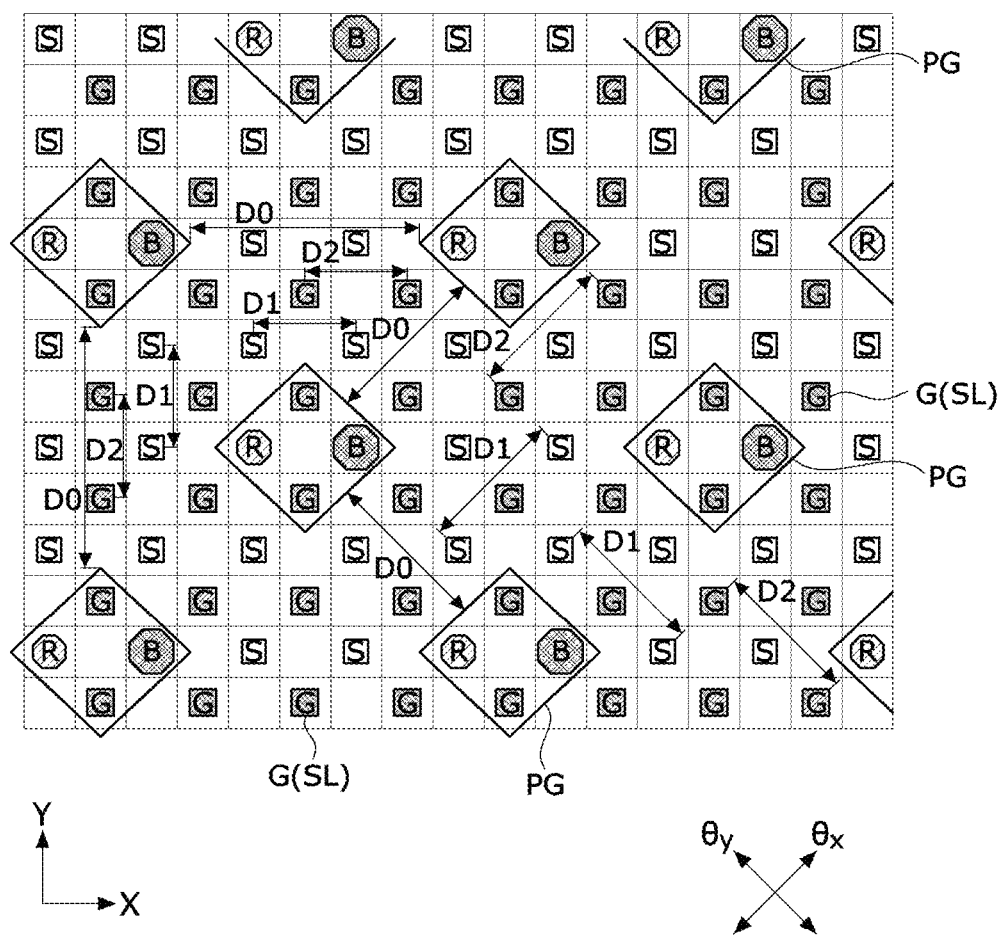
FIG. 5 is a diagram illustrating pixels, photosensors, and light sources in a first sensing area according to one embodiment of the present disclosure.
Figure 6:
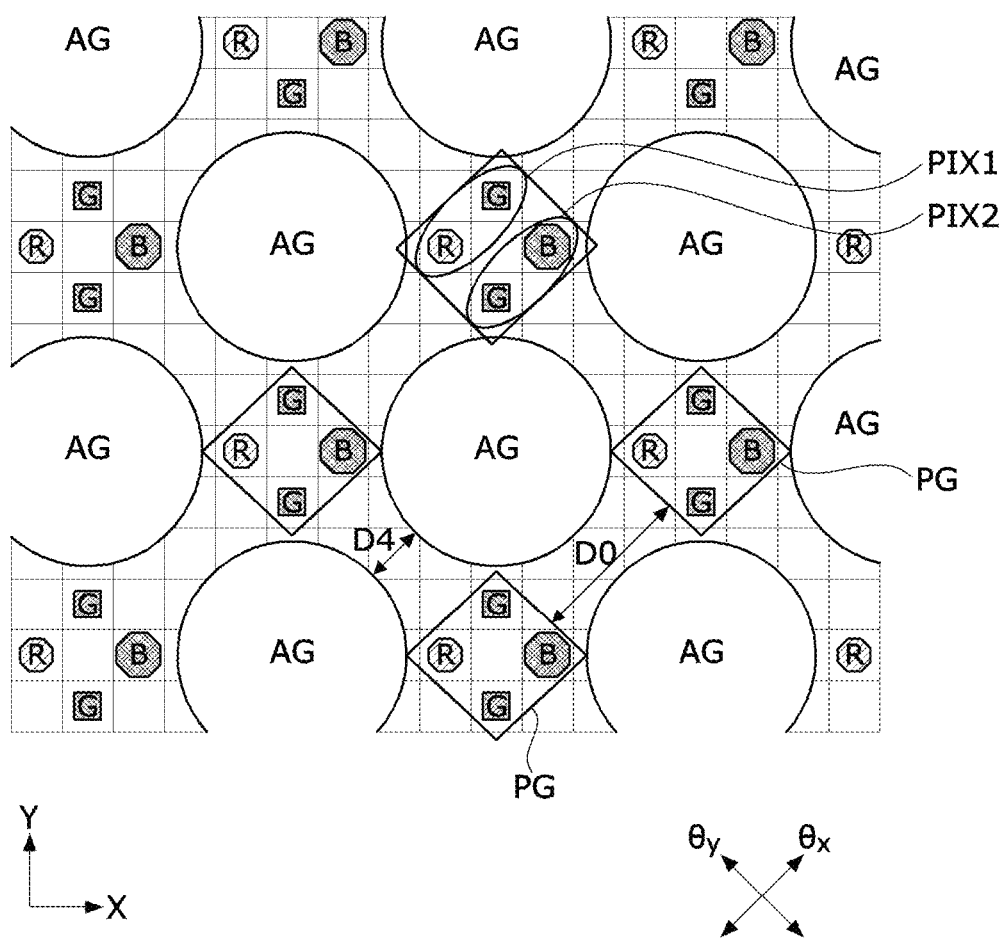
FIG. 6 is a diagram illustrating an arrangement of pixels and light transmitting parts in a second sensing area according to one embodiment of the present disclosure.

FIG. 4 is a diagram illustrating an example of a pixel arrangement in the display area DA according to one embodiment. FIG. 5 is a diagram illustrating an example of an arrangement of pixels, photosensors, and light sources in the first sensing area SA. FIG. 6 is a diagram illustrating an example of an arrangement of pixels and light transmitting parts in the second sensing area CA according to one embodiment. In FIGS. 4 to 6, lines connected to the pixels and lines connected to the photosensors are omitted.

Referring to FIG. 4, the display area DA includes pixels PIX1 and PIX2 disposed in the form of a matrix. Each of the pixels may be implemented as a real color pixel in which R, G, and B sub-pixels of three primary colors are formed in one pixel. Alternatively, each of the pixels may be formed such that two sub-pixels are formed in one pixel using a sub-pixel rendering algorithm. For example, a first pixel PIX1 may be formed of R and G sub-pixels, and a second pixel PIX2 may be formed of B and G sub-pixels. In each of the pixels PIX1 and PIX2, an insufficient color expression may be compensated for by an average value of pieces of corresponding color data between adjacent pixels.

Referring to FIG. 5, the first sensing area SA includes pixel groups PG spaced apart from each other by a predetermined distance D0, photosensors S disposed between adjacent pixel groups PG and spaced at equal intervals, and light sources SL disposed between adjacent pixel groups PG and spaced at equal intervals. The G sub-pixel used as the light source SL may emit light in the fingerprint recognition mode, whereas the G sub-pixel may be operated as a sensing light source which is in an OFF state in the display mode.

The pixel group PG may include one or two pixels. Each of the pixels of the pixel group PG may include two to four sub-pixels. For example, one pixel in the pixel group PG may include R, G, and B sub-pixels or two sub-pixels and may further include a W sub-pixel. The first pixel PIX1 may be formed of R and G sub-pixels and the second pixel PIX2 may be formed of B and G sub-pixels. Each of the photosensors S includes an organic/inorganic photodiode. Distances D1 between adjacent photosensors S in four directions X, Y, Θx, and Θy are substantially the same. An X-axis and a Y-axis denote two orthogonal directions. Θx and Θy denote inclined axis directions shifted by as much as an angle of 45° in the X-axis and the Y-axis, respectively. Distances D2 between adjacent light sources SL in the four directions X, Y, Θx, and Θy are substantially the same. The light sources SL may be turned on in the fingerprint recognition mode and may be implemented as sub-pixels of a specific color, preferably, G sub-pixels. In FIG. 5, the distance D1 between adjacent photosensors S and the distance D2 between adjacent light sources SL may be set as D1=D2, that is, may be set to be equal to each other. A shortest distance between a pixel group PG and a photosensor S, which are adjacent to each other, and a shortest distance between a pixel group PG and a light source SL, which are adjacent to each other, may be set to be substantially the same. The distance D0 between adjacent pixel groups PG may be greater than D1=D2.

Referring to FIG. 6, the second sensing area CA includes pixel groups PG spaced apart from each other by a predetermined distance D0, and light transmitting portions AG disposed between adjacent pixel groups PG and spaced apart from each other by an equal interval D4. External light is received by the lens 30 of the camera module through the light transmitting portions AG. The pixel group PG may include one or two pixels. For example, one pixel in the pixel group PG may include R, G, and B sub-pixels, or two sub-pixels may be disposed in the one pixel. The first pixel PIX1 may be formed of R and G sub-pixels and the second pixel PIX2 may be formed of B and G sub-pixels. The light transmitting portion AG may be formed of only a transparent medium so as to allow light to be incident on the camera module with minimal light loss. In other words, the light transmitting portion AG may be made of a transparent insulating material without including a metal line or a pixel. Distances D4 between adjacent light transmitting portions AG in the four directions X, Y, Θx, and Θy are substantially the same. In addition, distances D0 between adjacent pixel groups PG in the four directions X, Y, Θx, and Θy are the same.

In the fingerprint recognition mode, it is effective to use the G sub-pixel and B sub-pixel as the light sources for the first sensing area SA. The G sub-pixel has the highest light emission efficiency among the R, G, and B sub-pixels. Thus, the G sub-pixel may emit light with brightness sufficient for fingerprint sensing even at a low driving current. Meanwhile, since light having a long wavelength, such as infrared light and red light, passes through the human skin well, when the R sub-pixel is used as a light source in the fingerprint recognition mode, long wavelength light from sunlight or strong external light, which passes through a finger, increases noise of a photosensor signal. Meanwhile, when green light or blue light is used as sensing light (an effective light source) in the fingerprint recognition mode, since the finger blocks short wavelength light, the photosensor may reduce noise due to external light. Thus, a cyan pixel formed of a G sub-pixel or a combination of G and B sub-pixels may be used as the light source in the fingerprint recognition mode.

Figure 7:
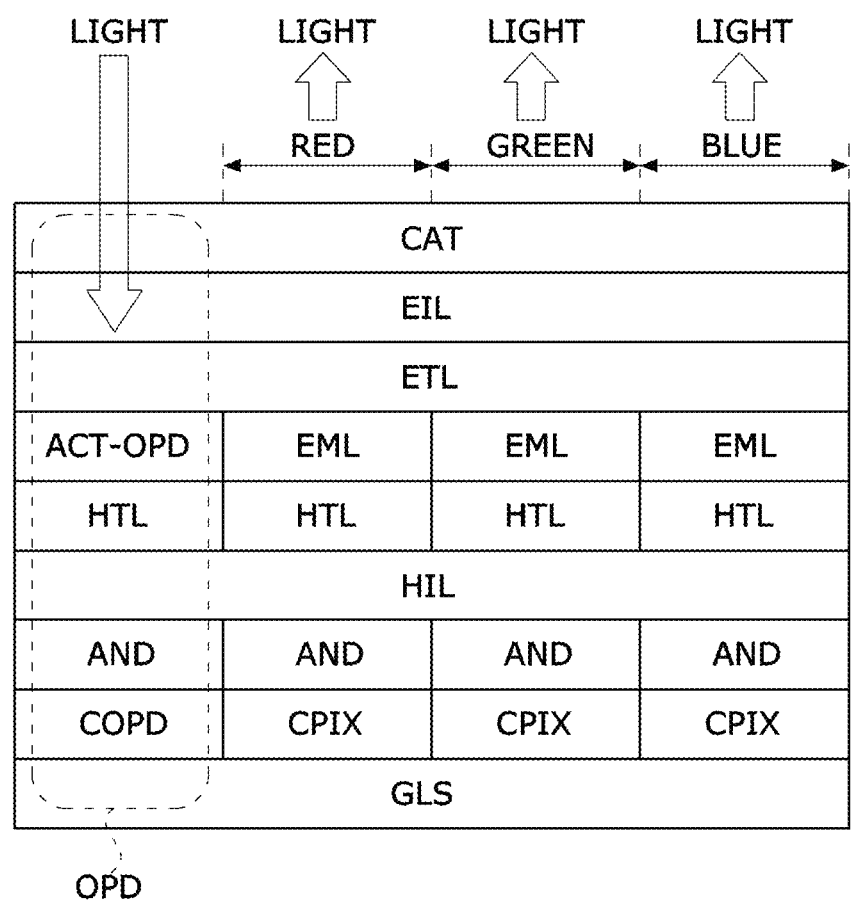
FIG. 7 is a diagram illustrating cross-sectional structures of an organic photodiode and a pixel according to one embodiment of the present disclosure.

FIG. 7 is a diagram illustrating cross-sectional structures of an organic photodiode and a pixel according to one embodiment of the present disclosure.

Referring to FIG. 7, the photosensor S of the first sensing area SA may be implemented as an organic photodiode OPD in accordance with one embodiment. The organic photodiode OPD may be implemented in a cross-sectional structure which is substantially the same as a cross-sectional structure of the OLED of the R, G, and B sub-pixel.

The R, G, and B sub-pixels may be implemented as a combination of a white OLED and a color filter, or a red OLED, a green OLED, and a blue OLED, in which dopants added to a host material of a light emission layer are different for each color. The OLED of each of the R, G, and B sub-pixels includes an anode electrode AND, a hole injection layer HIL, a hole transport layer HTL, a light emission layer EML, an electron transport layer ETL, an electron injection layer EIL, and a cathode electrode CAT which are stacked on a pixel circuit CPIX. The hole injection layer HIL is in contact with the anode electrode AND of the R, G, and B sub-pixels, and the electron injection layer EIL is in contact with the cathode electrode CAT.

The organic photodiode OPD includes an anode electrode AND, the hole injection layer HIL, a hole transport layer HTL, an active layer ACT-OPD, the electron transport layer ETL, the electron injection layer EIL, and the cathode electrode CAT which are stacked on a photosensor drive circuit COPD. The active layer ACT-OPD of the organic photodiode OPD includes known organic semiconductor materials.

Organic semiconductor materials which may be coated by a solution process, for example, one or two or more organic semiconductor materials among P3HT:PC61BM, squaraine: PC61BM, C60, PBDTTT-C:PC71BM, PDPP3T:PC71BM, PCDTBT:PC61BM, PVK:PC71BM, PCDTBT:PC71BM, ZnO:F8T2, PBDT-TFTTE:PC71BM, P3HT:PC61BM, TAPC:C60, P3HT:PC60BM, PFBT2OBT:PC71BM, PIDT-TPD:PC61BM, P3HT:PC71BM, PV-D4650:PC61BM, P3HT:O-IDTBR, and 2,9-dimethylquinacridone (2,9-DMQA), may be used as the active layer ACT-OPD of the organic photodiode OPD, but the present disclosure is not limited thereto. Since the organic semiconductor material may be processed in a solution process at a relatively low temperature when compared with an inorganic semiconductor material formed in a high-temperature deposition process, a manufacturing cost may be reduced and the organic semiconductor material may be applied to a flexible display.

As can be seen from FIG. 7, the organic photodiode OPD has a cross-sectional structure that is substantially the same as the cross-sectional structures of the R, G, and B sub-pixels, and most of the layers may be formed of the same material as the R, G, and B sub-pixels. Thus, since the organic photodiode OPD and the OLEDs of the R, G, and B sub-pixels may be formed in the same manufacturing process and have the same cross-sectional structure, most circuit components are shared so that a structure of the display panel 100 may be simplified.

Figure 8:
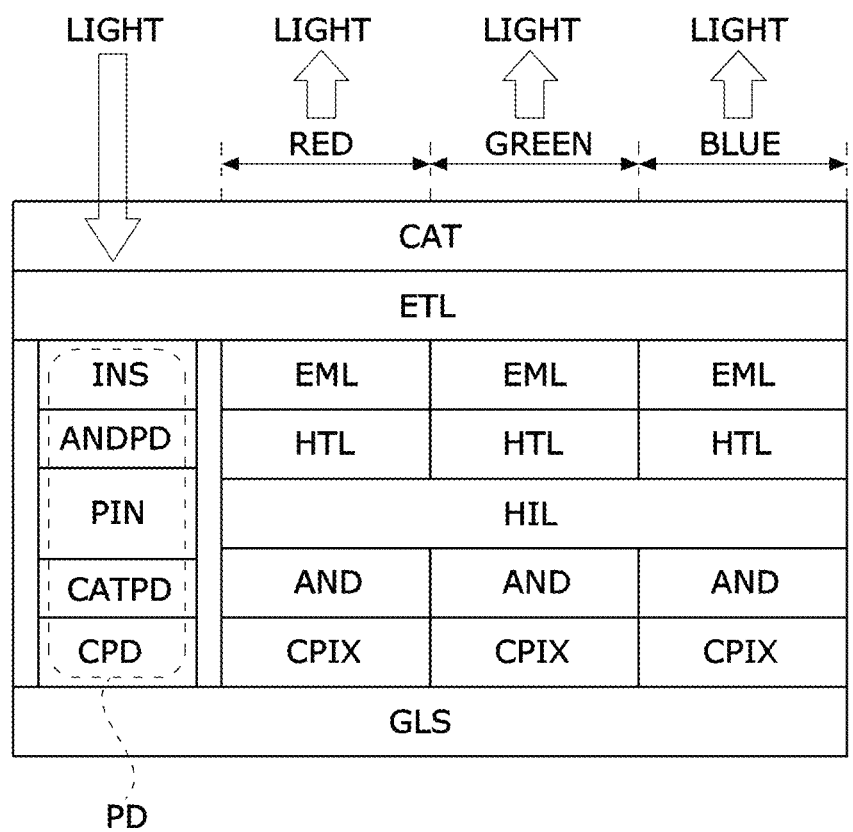
FIG. 8 is a diagram illustrating cross-sectional structures of an inorganic photodiode and a pixel according to one embodiment of the present disclosure.

FIG. 8 is a diagram illustrating cross-sectional structures of an inorganic photodiode and a pixel according to one embodiment of the present disclosure. In FIG. 8, the electron injection layer EIL and the hole injection layer HIL are omitted.

Referring to FIG. 8, the photosensor S of the first sensing area SA may be implemented as an inorganic photodiode PD.

An active layer PIN of the inorganic photodiode PD has a PIN junction structure in which an undoped semiconductor layer is present between an ion-doped P region and ion-doped N region. Amorphous silicon (a-Si) may be used as a semiconductor material of the inorganic photodiode PD. Since the P region has a high light absorption rate, photoelectric conversion efficiency of the inorganic photodiode PD is high when the P region is located on an incident side of light. The R, G, and B sub-pixels may be implemented as top emission type OLEDs in which light passes through a cathode electrode which is a semi-transmissive electrode. In this case, electrodes of the R, G, and B sub-pixels and the inorganic photodiode PD may be formed to be reversed. For example, a metal layer in contact with the circuit layer 12 may be patterned as the anode electrodes AND of the R, G, and B sub-pixels, and a portion of the metal layer may be patterned as a cathode electrode CATPD of the inorganic photodiode PD. The cathode electrodes CAT of the R, G, and B sub-pixels are electrically separated from an anode electrode ANDPD of the inorganic photodiode PD. In this case, an insulating layer INS and the electron transport layer ETL may be disposed between the cathode electrodes CAT of the R, G, and B sub-pixels and the anode electrode ANDPD of the inorganic photodiode PD.

A cathode electrode CATPD of the inorganic photodiode PD may be connected to the photosensor drive circuit COPD. The cathode electrode CATPD of the inorganic photodiode PD may be formed on the same layer as or formed to be coplanar with the anode electrodes AND of the R, G, and B sub-pixels, but the cathode electrode CATPD is electrically separated from the anode electrodes AND. The anode electrode ANDPD of the inorganic photodiode PD may be formed on the same layer as the hole transport layers HTL of the R, G, and B sub-pixels, but the anode electrode ANDPD is electrically separated from the hole transport layers HTL. In the active layer PIN of the inorganic photodiode PD, a P region may be in contact with the anode electrode ANDPD, and an N region may be in contact with the cathode electrode CATPD.

The inorganic photodiode PD is electrically completely separated from the light-emitting elements OLED of the pixels. The anode electrode ANDPD of the inorganic photodiode PD should be electrically separated from the organic compound layer and the cathode electrode CAT of an adjacent light-emitting element OLED due to the insulating layer INS. In addition, the cathode electrode CATPD of the inorganic photodiode PD should also definitely be electrically separated from the organic compound layer and the anode electrode AND of the adjacent light-emitting element OLED.

Figure 9:
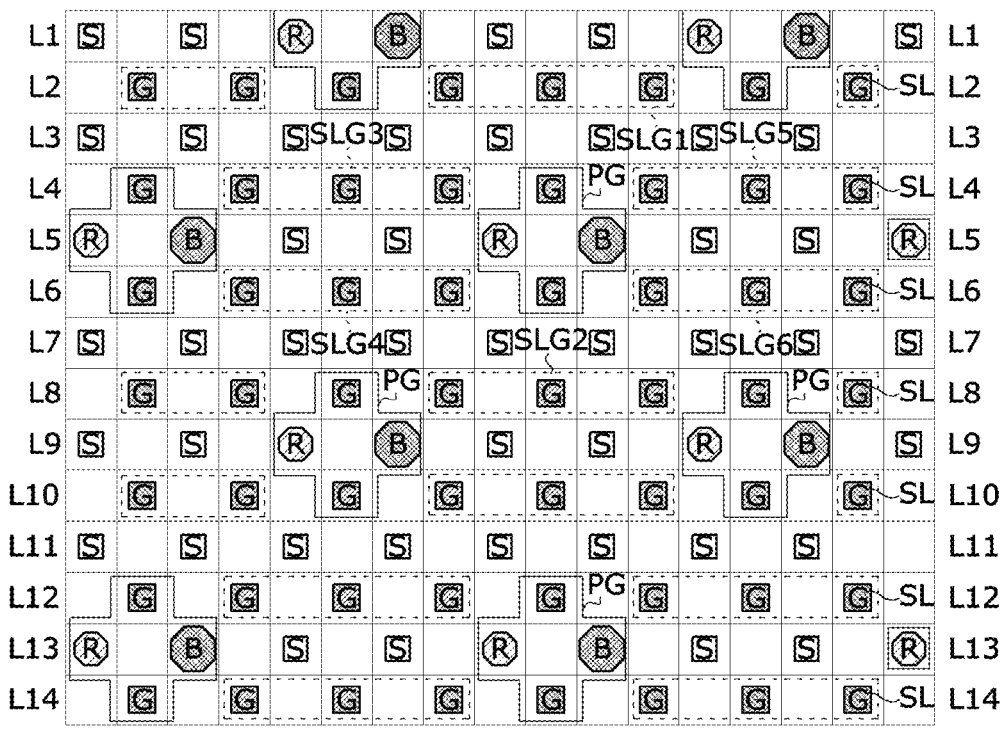
FIG. 9 is a detailed diagram illustrating an arrangement of fingerprint sensing light sources in the first sensing area shown in FIG. 5 according to one embodiment of the present disclosure.

FIG. 9 is a detailed diagram illustrating an arrangement of fingerprint sensing light sources in the first sensing area SA shown in FIG. 5.

Referring to FIG. 9, the fingerprint sensing light source of the first sensing area SA may be implemented as a G sub-pixel which has substantially the same structure as the G sub-pixel of the pixel group PG. Like sub-pixels for display driving, the G sub-pixel used as the fingerprint sensing light source is connected to a data driver 306 (see FIG. 16) through a data line. Thus, the fingerprint sensing light source may emit light according to a light source driving voltage supplied from the data driver 306.

The fingerprint sensing light source emits light in only the fingerprint recognition mode and does not emit light in the display mode. For example, at least one among the sub-pixels of the pixel group PG may emit light in the fingerprint recognition mode according to a fingerprint state of the user and an external environment to be used as the fingerprint sensing light source, as necessary.

One R sub-pixel, one B sub-pixel, and two G sub-pixels may be disposed in each of the pixel groups PG. The R, G, and B sub-pixels may be disposed in the form of a rhombic shape or a cross shape in one pixel group PG. As indicated by a dotted line, adjacent pixel groups PG may be disposed in the form of a rhombic shape and a zigzag shape. One or more photosensors S and one or more sensing light sources SL are disposed between the adjacent pixel groups PG in each of the four directions X, Y, Θx, and Θy.

Two or more photosensors S are disposed between pixel groups PG adjacent in the horizontal direction X, and two or more photosensors S are disposed between pixel groups PG adjacent in the vertical direction Y.

The fingerprint sensing light source may be disposed adjacent to each of the photosensors S. The fingerprint sensing light source may be divided into a first light source group SLG1 disposed above the pixel group PG in the vertical direction Y, a second light source group SLG2 disposed below the pixel group PG in the vertical direction Y, third and fourth light source groups SLG3 and SGL4 disposed on a left side of the pixel group PG in the horizontal direction X, and fifth and sixth light source groups SLG5 and SGL6 disposed on a right side of the pixel group PG in the horizontal direction X. Each of the light source groups SLG1 to SLG6 may include two or more photosensors S.

A photosensor row in which photosensors S are disposed in a line is disposed between the first light source group SLG1 and a pixel group PG there below. A photosensor row in which photosensors S are disposed in a line is disposed between the second light source group SLG2 and a pixel group PG there above. For example, in the first sensing area SA, the photosensors S may be disposed in a line in $(4k-1)^{th}$ pixel lines (L3, L7, and L11) (k is a natural number) without the sensing light sources SL and the R, G, and B sub-pixels of the pixel group PG.

One or more photosensors S may be disposed between the third light source group SLG3 and the fourth light source group SLG4. One or more photosensors S may be disposed between the third light source group SLG3 and a pixel group PG there above, and one or more photosensors S may be disposed between the fourth light source group SLG4 and a pixel group PG there below. One or more photosensors S may be disposed between the fifth light source group SLG5 and the sixth light source group SLG6. One or more photosensors S may be disposed between the fifth light source group SLG5 and a pixel group PG there above, and one or more photosensors S may be disposed between the sixth light source group SLG6 and a pixel group PG there below.

When imaginary lines passing through centers of the first to sixth light source groups SLG1 to SLG6 adjacent to the pixel groups PG are connected, the light source groups SLG1 to SLG6 may be disposed in the form of a hexagonal shape based on one pixel group PG.

FIGS. 10A to 10D are diagrams illustrating an operation of the first sensing area shown in FIG. 9 according to one embodiment.

Figure 10A:
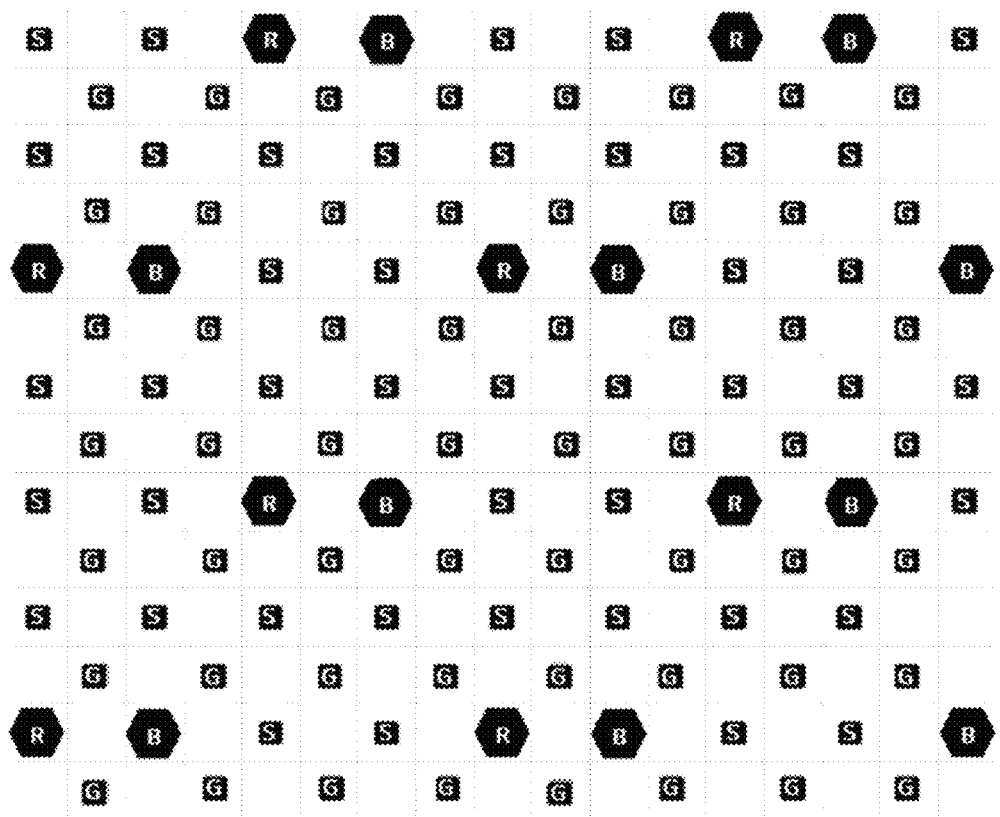
FIGS. 10A to 10D are diagrams illustrating an operation of the first sensing area shown in FIG. 9 according to one embodiment of the present disclosure.

Referring to FIG. 10A, the pixels of the first sensing area SA may be in a non-driving state in a power-off state, a standby mode, and a non-driving frame period during low-speed driving. In the non-driving state, the pixels do not emit light (pixel OFF). In the non-driving state, the photosensors S may not be driven so as to reduce power consumption.

Figure 10B:
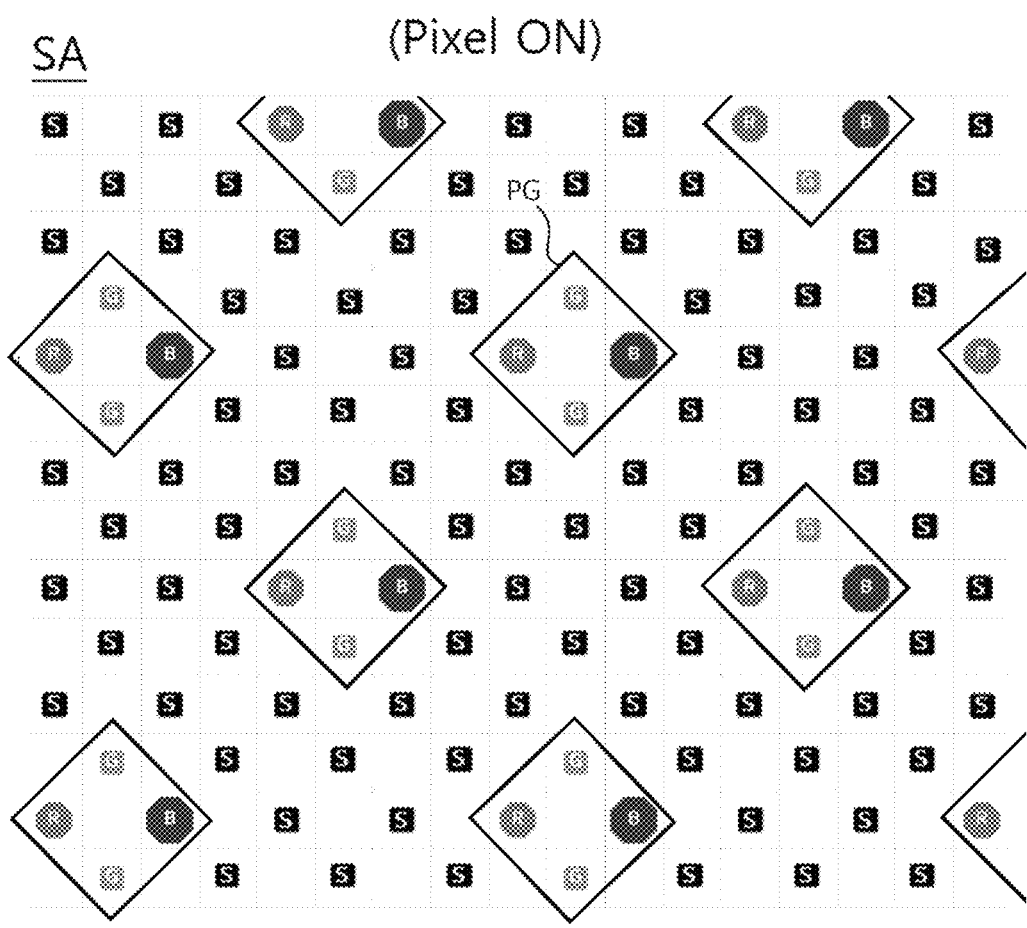

Referring to FIG. 10B, the pixels of the first sensing area SA may be charged at a data voltage of pixel data in the display mode and emit light at a brightness according to a gray scale value of the pixel data. Thus, the first sensing area SA may display an input image in the display mode.

Figure 10C:
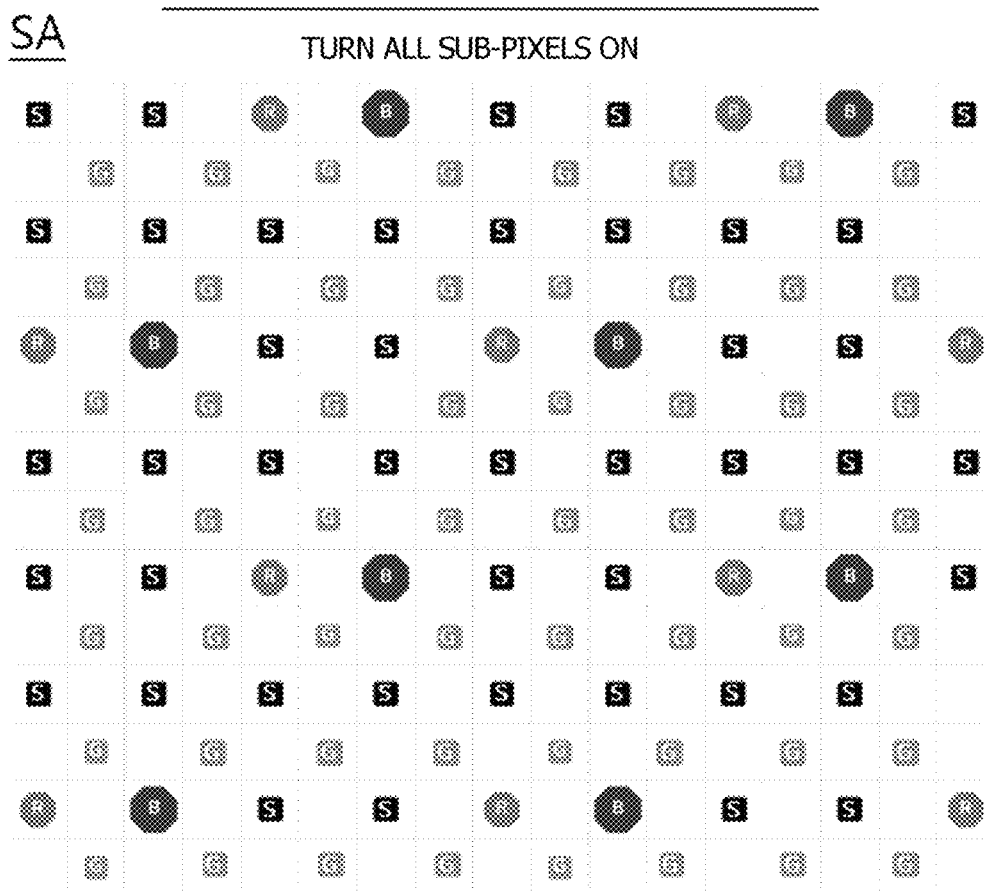
Figure 10D:
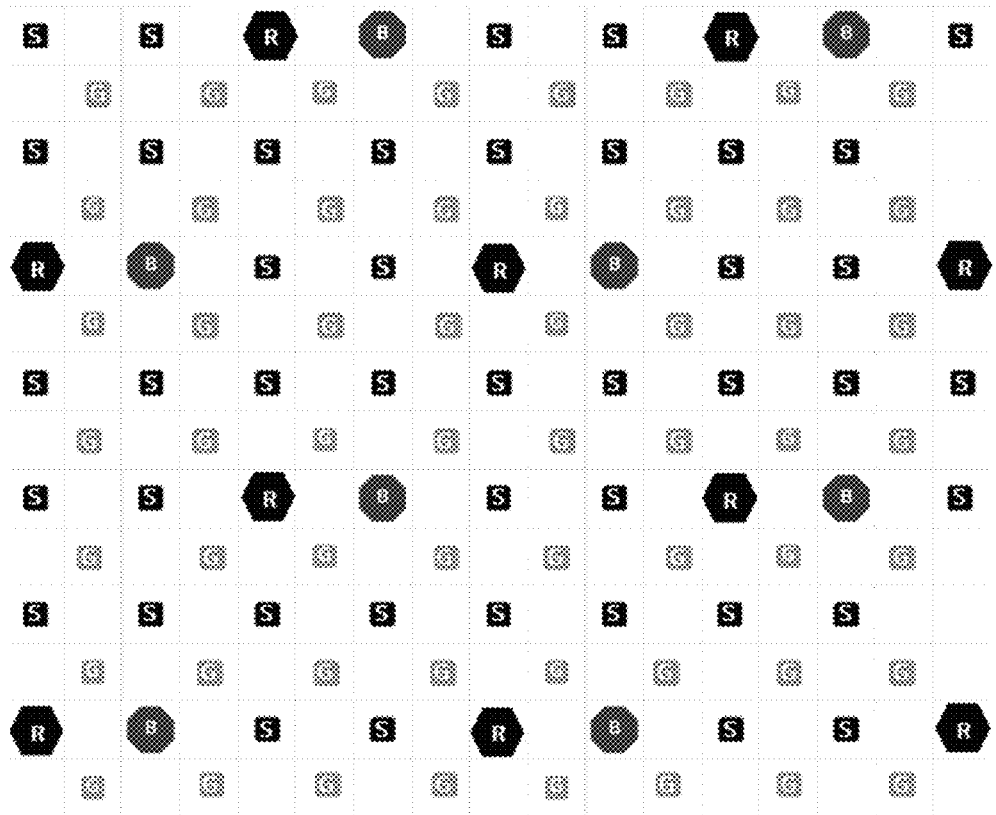

In the first sensing area SA, one or more sub-pixels and the sensing light source SL in each of the pixel groups PG may be turned on in the fingerprint recognition mode (pixel ON). For example, only the sensing light source SL may be turned on in the fingerprint sensing mode, or as shown in FIGS. 10C and 10D, the G sub-pixel or the G and B sub-pixels may be turned on in the pixel group PG together with the sensing light source SL. The light-emitting element OLED emits light in the sub-pixels which emit light in the fingerprint recognition mode.

FIGS. 10C and 10D are diagrams illustrating an example of the sub-pixels which are turned on in the fingerprint recognition mode.

As shown in FIG. 10C, all of the R, G, and B sub-pixels of the first sensing area SA including the G sub-pixels used as the sensing light sources SL may be turned on in the fingerprint recognition mode. As another example, as shown in FIG. 10D, all of the G and B sub-pixels of the first sensing area SA including the G sub-pixels used as the sensing light sources SL may be turned on in the fingerprint recognition mode.

Figure 11:
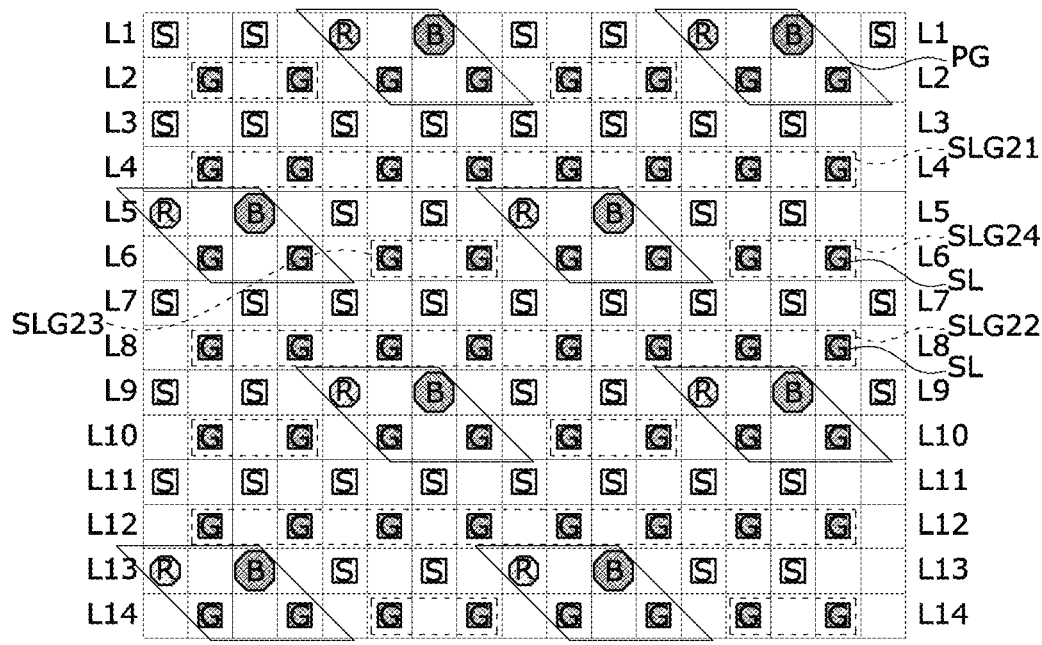
FIG. 11 is a diagram illustrating an example of an arrangement of pixels, photosensors, and light sources in a first sensing area according to another embodiment of the present disclosure.

FIG. 11 is a diagram illustrating pixels, photosensors, and light sources in a first sensing area according to another embodiment of the present disclosure.

Referring to FIG. 11, the fingerprint sensing light source of the first sensing area SA may be implemented as a G sub-pixel which has substantially the same structure as the G sub-pixel of the pixel group PG.

The fingerprint sensing light source emits light in only the fingerprint recognition mode and does not emit light in the display mode. For example, at least one among the sub-pixels of the pixel group PG may emit light in the fingerprint recognition mode according to a fingerprint state of the user and an external environment to be used as the fingerprint sensing light source, as necessary.

One R sub-pixel, one B sub-pixel, and two G sub-pixels may be disposed in each of the pixel groups PG. The R, G, and B sub-pixels may be disposed in the form of a zigzag shape or a parallelogram shape in one pixel group PG. As indicated by a dotted line, adjacent pixel groups PG may be disposed in the form of a rhombic shape and a zigzag shape. One or more photosensors S and one or more sensing light sources SL are disposed between the adjacent pixel groups PG in each of the four directions X, Y, θx, and Oy.

Two or more photosensors S are disposed between pixel groups PG adjacent in the horizontal direction X, and two or more photosensors S are disposed between pixel groups PG adjacent in the vertical direction Y.

The fingerprint sensing light source may be disposed adjacent to each of the photosensors S. The fingerprint sensing light source may be divided into a first light source group SLG21 disposed above a pixel group PG in the vertical direction Y, a second light source group SLG22 disposed below the pixel group PG in the vertical direction Y, a third light source group SLG23 disposed on a left side of a pixel group PG in the horizontal direction X, and a fourth light source group SLG24 disposed on a right side of the pixel group PG in the horizontal direction X. Each of the light source groups SLG21 to SLG24 may include two or more photosensors S.

Each of the first and second light source groups SLG21 and SLG22 may include a light source row in which sensing light sources SL are disposed in a line in the horizontal direction X. For example, in the first sensing area SA, the sensing light sources SL may be disposed in a line on $4k^{th}$ pixel lines L4, L8, and L12 (k is a natural number) without the light sources SL and R, G, and B sub-pixels of the pixel group PG.

A photosensor row in which the photosensors S are disposed in a line in the horizontal direction X is disposed above each of the first and second light source groups SLG21 and SLG22. For example, in the first sensing area SA, the photosensors S may be disposed in a line on $(4k^{th}-1)$ pixel lines L3, L7, and L11 (k is a natural number) without the photosensors S and the R, G, and B sub-pixels of the pixel group PG.

One or more photosensors S may be disposed between the first light source group SLG21 and the third light source group SLG23. One or more photosensors S may be disposed between the second light source group SLG22 and the third light source group SLG23. One or more photosensors S may be disposed between the first light source group SLG21 and the fourth light source group SLG24. One or more photosensors S may be disposed between the second light source group SLG22 and the fourth light source group SLG24.

As described above, in the first sensing area SA shown in FIG. 11, only the sensing light source SL is turned on in the fingerprint recognition mode, or as shown in FIGS. 10C and 10D, the G sub-pixel or the G and B sub-pixels may be turned on in the pixel group PG together with the sensing light source SL.

Figure 12:
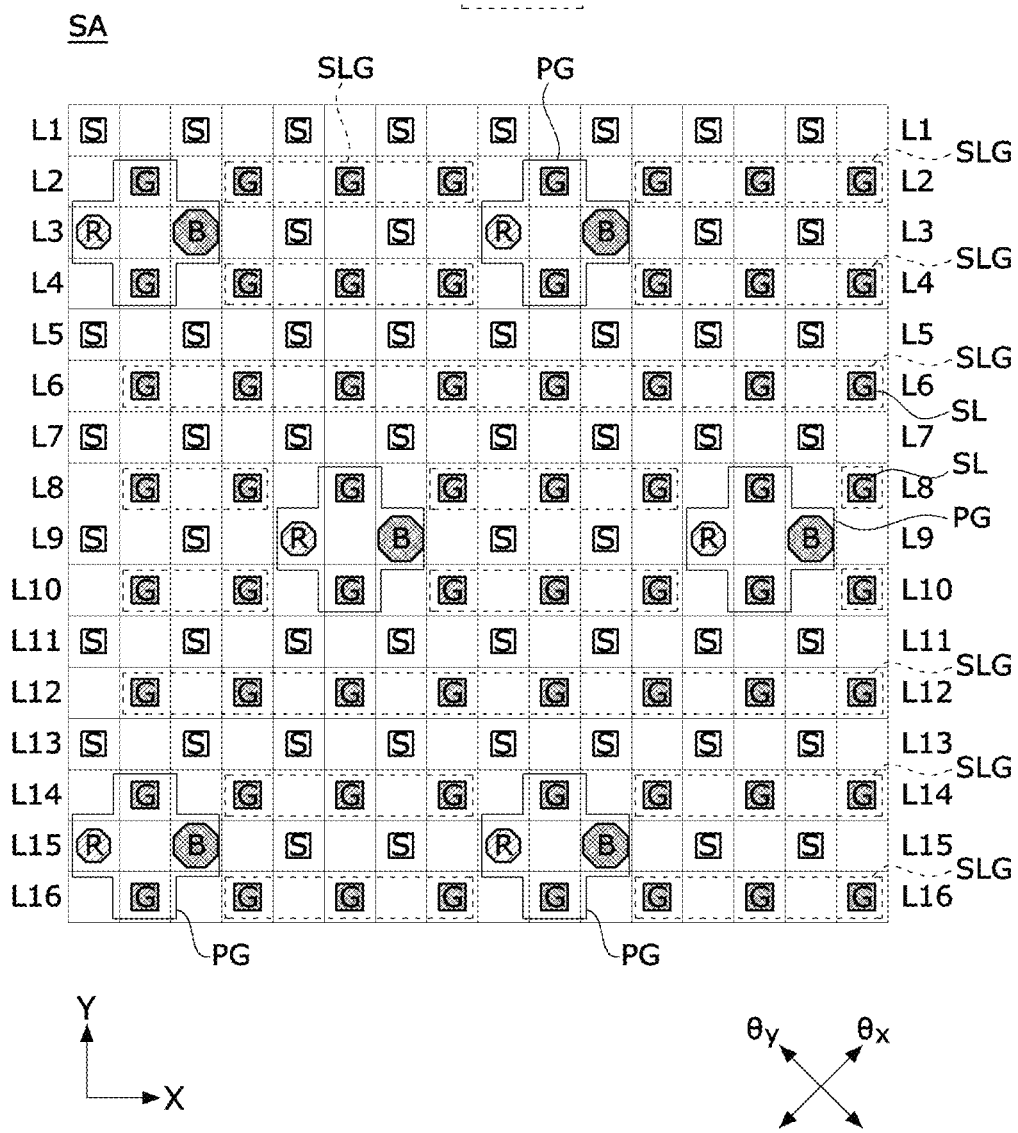
FIGS. 12 and 13 are diagrams illustrating pixels, photosensors, and light sources in a first sensing area according to still another embodiment of the present disclosure.
Figure 13:
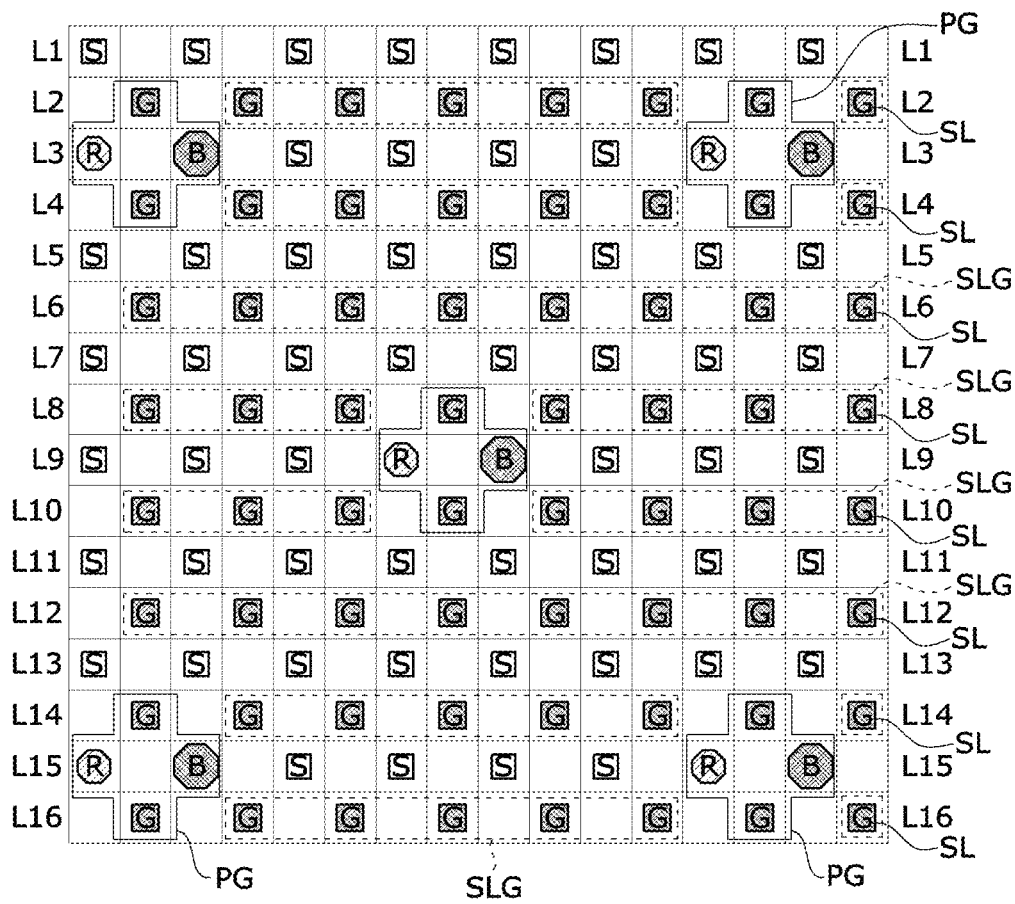

FIGS. 12 and 13 are diagrams illustrating pixels, photosensors, and light sources in a first sensing area according to still another embodiment of the present disclosure.

Referring to FIGS. 12 and 13, in a first sensing area SA, an interval between pixel groups PG is increased, and more photosensors are disposed therebetween so that a resolution of a fingerprint recognition sensor may be increased. As described above, when a PPI of the first sensing area SA is decreased, in the present disclosure, since more sensing light sources SL are required so as to secure minimum light emission brightness for fingerprint recognition, more pixels used as the sensing light sources SL are disposed in the first sensing area SA as the PPI is decreased. Here, as shown in FIGS. 9 to 13, in order to increase accuracy of the fingerprint recognition in the photosensors S and the sub pixels used as the sensing light sources SL, it is preferable that the sensing light sources SL and the photosensors S are uniformly disposed at equal intervals on an entirety of the first sensing area SA.

A sharpness of a fingerprint pattern image obtained from the photosensors S may be varied according to a fingerprint state and the surrounding environment. When the sharpness of the fingerprint pattern image is low, a fingerprint recognition rate is decreased. The sharpness of the fingerprint pattern image may be determined by a ridge-valley contrast of a fingerprint in the fingerprint pattern image. According to the present disclosure, as shown in FIG. 14, in order to obtain an optimal fingerprint pattern image in various fingerprint states and various external environments, a plurality of fingerprint pattern images may be obtained while the number of light sources, which are turned on in the fingerprint recognition mode, is varied and fingerprint authentication may be performed on the basis of a pattern image having the highest sharpness among the obtained fingerprint pattern images.

Figure 14:
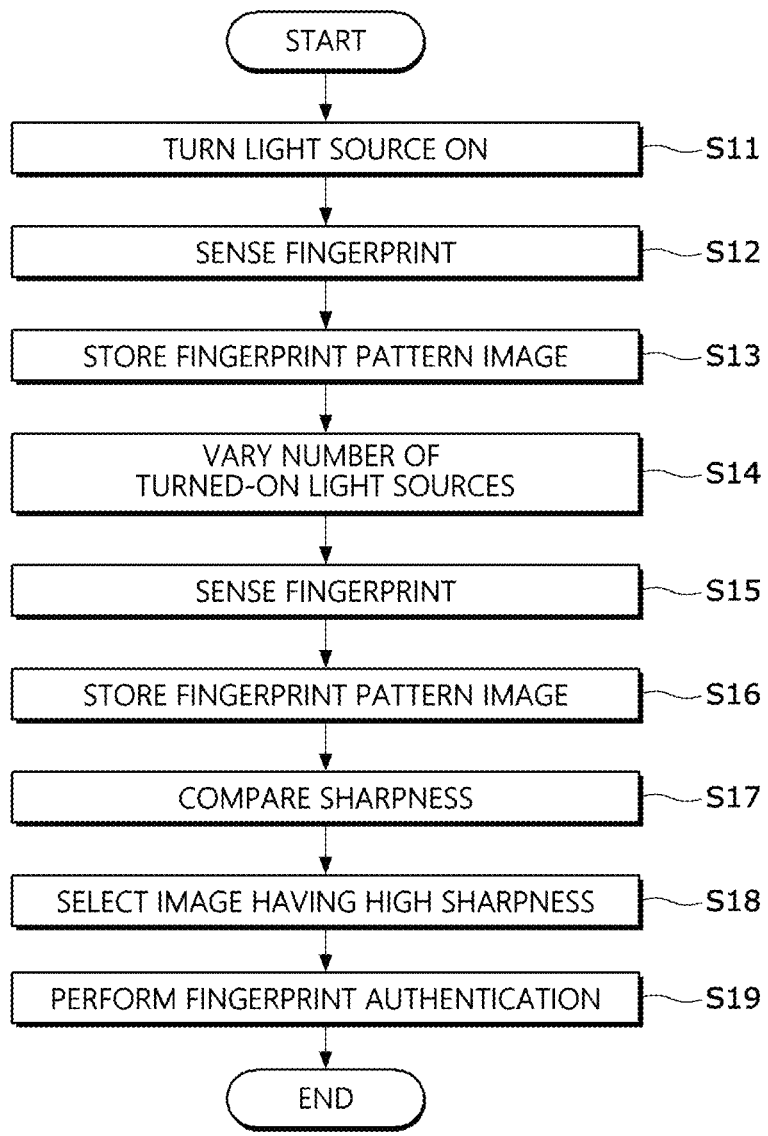
FIG. 14 is a flowchart illustrating an example of a fingerprint authentication method of selecting a fingerprint pattern image having a high sharpness while the number of light sources turned on in the fingerprint recognition mode is varied according to one embodiment of the present disclosure.

FIG. 14 is a flowchart illustrating an example of a fingerprint authentication method of selecting a fingerprint pattern image having a high sharpness while the number of light sources turned on in the fingerprint recognition mode is varied according to one embodiment.

Referring to FIG. 14, when the fingerprint recognition mode starts and a finger of a user is sensed in the first sensing area SA, the fingerprint recognition processor turns the light sources of the first sensing area SA on (S11). After the light sources are turned on, the photosensors S are driven to sense a fingerprint of the user (S12). The fingerprint recognition processor converts outputs of the photosensors S into digital data to generate fingerprint pattern image data and stores the fingerprint pattern image data in a memory (S13).

Then, the fingerprint recognition processor varies the number of light sources to be turned on to adjust brightness of the sensing light source (S14). In this case, the number of light sources to be turned on may be increased or decreased, the number of light sources to be turned on may be increased and then decreased, or as opposed thereto, ON/OFF of the turned-on light sources may be controlled. Whenever the number of light sources to be turned on is varied, the photosensors S are driven to sense the fingerprint of the user (S15). The fingerprint recognition processor converts outputs of the photosensors S into digital data to generate fingerprint pattern image data and stores the fingerprint pattern image data in the memory (S16). Fingerprint sensing may be repeatedly performed as the number of light sources to be turned on is varied by as much as a preset number of repetitions.

The fingerprint recognition processor may compare sharpnesses of the fingerprint pattern images stored in the memory, select a fingerprint pattern image having the highest sharpness, and transmit the fingerprint pattern image having the highest sharpness to the host system (S17 and S18). The host system may perform fingerprint authentication by comparing the fingerprint pattern image received through the fingerprint recognition processor with pre-stored user fingerprint data (S19).

Figure 15:
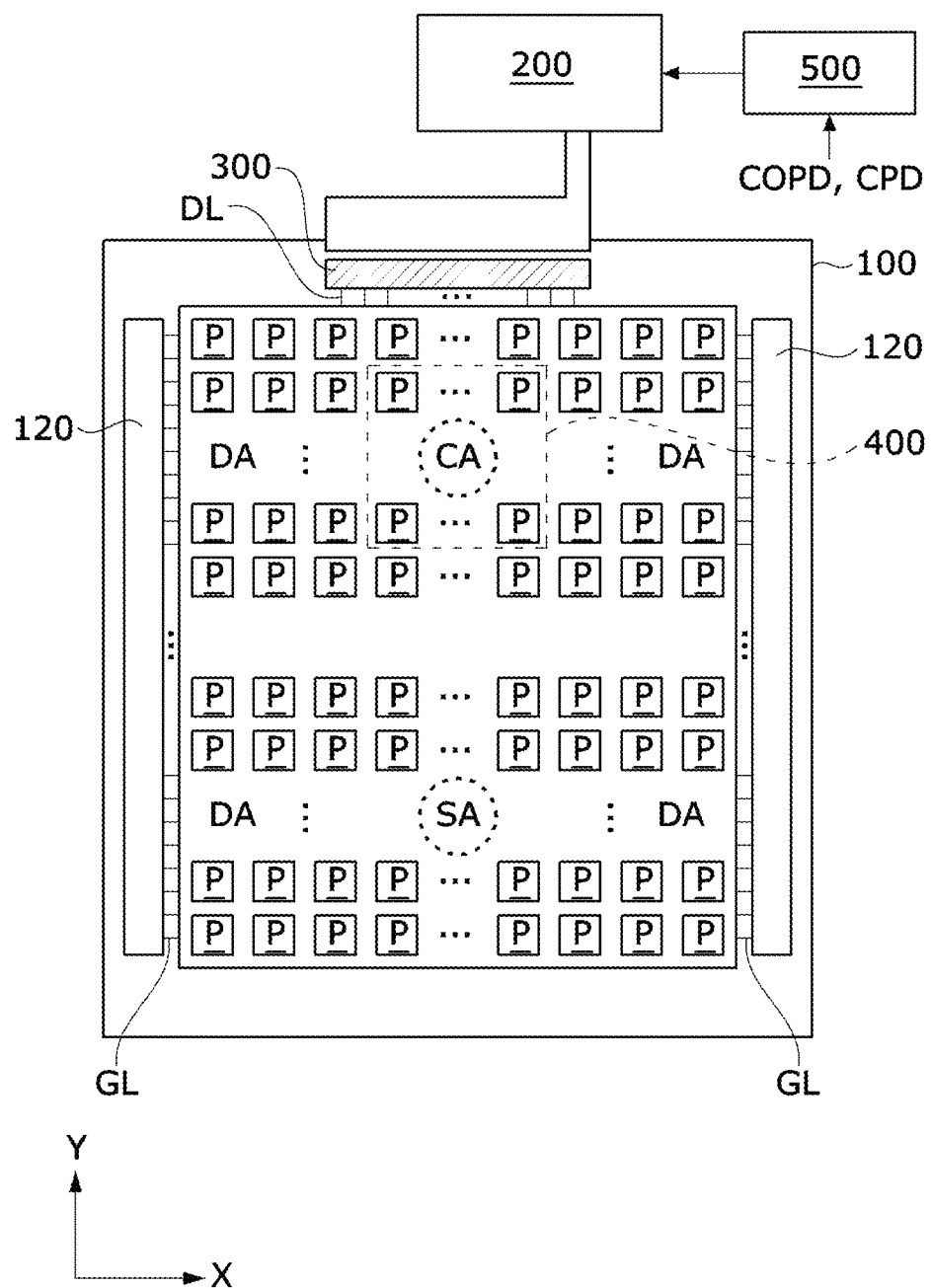
FIG. 15 is a block diagram illustrating a display panel and a display panel driver according to an embodiment of the present disclosure.
Figure 16:
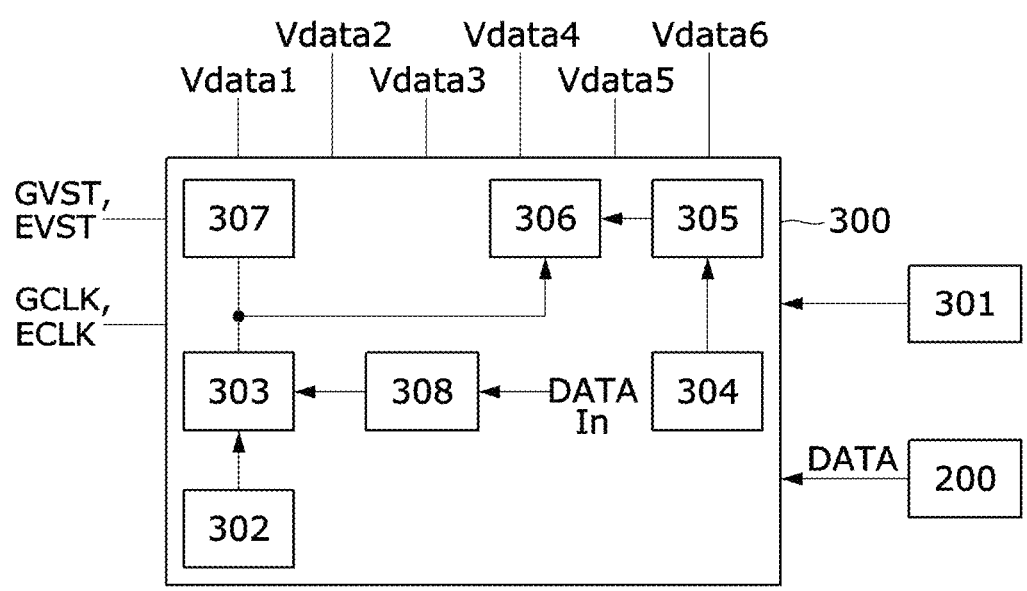
FIG. 16 is a schematic block diagram illustrating a configuration of a drive integrated circuit (IC) according to an embodiment of the present disclosure.

FIG. 15 is a block diagram illustrating a display panel and a display panel driver according to an embodiment of the present disclosure. FIG. 16 is a schematic block diagram illustrating a configuration of a drive integrated circuit (IC) according to an embodiment of the present disclosure.

Referring to FIGS. 15 and 16, a display device includes a display panel 100 in which a pixel array is disposed on a screen, and a display panel driver.

Figure 17:
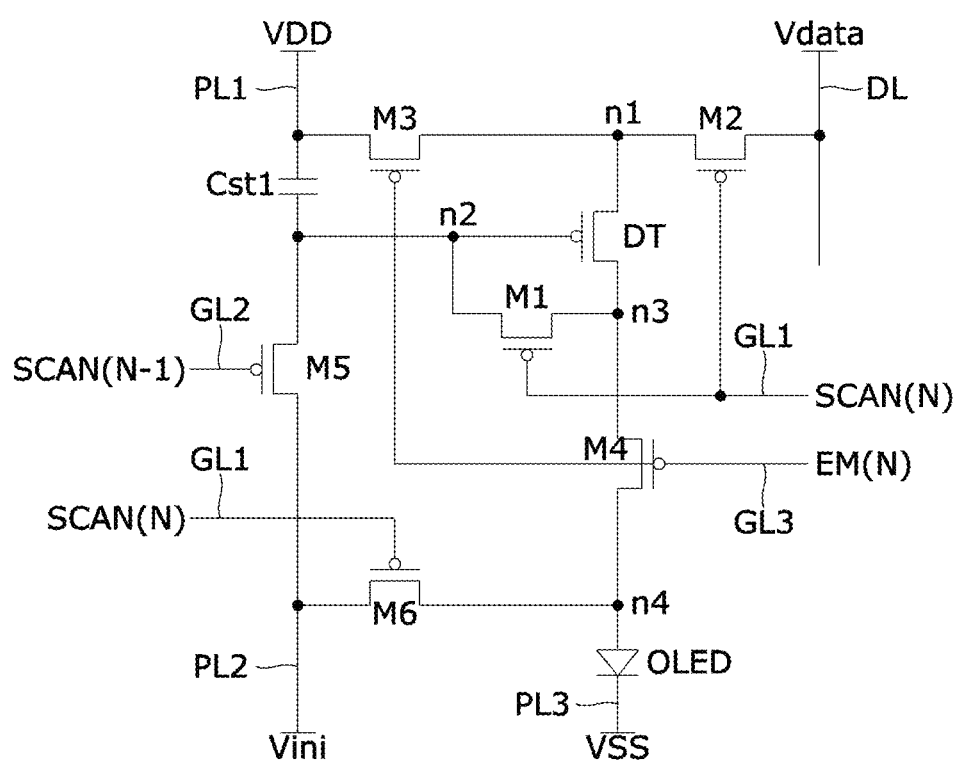
FIG. 17 is a circuit diagram illustrating an example of a pixel circuit according to an embodiment of the present disclosure.

The pixel array of the display panel 100 includes data lines DL, gate lines GL intersecting the data lines DL, and pixels P disposed in the form of a matrix defined by the data lines DL and the gate lines GL. The pixel array further includes power lines such as a VDD line PL1, a Vini line PL2, and a VSS line PL3 which are shown in FIG. 17.

As shown in FIG. 1, the pixel array may be divided into a circuit layer 12 and a light-emitting element and a sensor layer 14. A touch sensor array may be disposed above the light-emitting element and the sensor layer 14. As described above, each of pixels of the pixel array may include two to four sub-pixels. Each of the sub-pixels includes a pixel circuit disposed in the circuit layer 12.

In the display panel 100, a screen on which an input image is reproduced includes a display area DA, a first sensing area SA, and a second sensing area CA.

Sub-pixels of each of the display area DA, the first sensing area SA, and the second sensing area CA include a pixel circuit. The pixel circuit may include a driving element which supplies a current to a light-emitting element OLED, a plurality of switching elements for sampling a threshold voltage of the driving element and switching a current path of the pixel circuit, and a capacitor which maintains a gate voltage of the driving element. The pixel circuit is disposed below the light-emitting element OLED.

The first sensing area SA of the display panel 100 includes photosensors for sensing a fingerprint, a photosensor drive circuit for driving the photosensors, and sensing light sources between pixel groups. The photosensors and the sensing light sources may be uniformly disposed at equal intervals in the first sensing area SA. The photosensor drive circuit is disposed below the photosensors.

The second sensing area CA includes light transmitting parts disposed between the pixel groups, and a camera module 400 disposed below the second sensing area CA. The camera module 400 photoelectrically converts light incident through the second sensing area CA using an image sensor in a capturing mode, converts pixel data of an image output from an image sensor into digital data, and outputs the captured image data.

The display panel driver writes pixel data of an input image in pixels P. The pixels P may be construed as the pixel group including the plurality of sub-pixels.

The display panel driver includes a data driver 306 which supplies a data voltage of pixel data to the data lines DL, and a gate driver 120 which sequentially supplies a gate pulse to the gate lines GL. The data driver 306 may be integrated in a drive IC 300. The display panel driver may further include a touch sensor driver which is omitted from the drawings.

The drive IC 300 may be bonded to the display panel 100. The drive IC 300 receives a pixel data and a timing signal of an input image from a host system 200, supplies a data voltage of the pixel data to the pixels, and synchronizes the data driver 306 with the gate driver 120.

The drive IC 300 is connected to the data lines DL through data output channels to supply the data voltage Vdata1~Vdata6 of the pixel data DATA to the data lines DL. The drive IC 300 may output a gate timing signal for controlling the gate driver 120 through gate timing signal output channels. The gate timing signal generated from a timing controller 303 may include a gate start pulse VST and a gate shift clock CLK. The gate start pulse VST and the gate shift clock CLK swing between a gate-on voltage VGL and a gate-off voltage VGH. The gate timing signals VST and CLK output from a level shifter 307 are applied to the gate driver 120 to control a shift operation of the gate driver 120.

The gate driver 120 may include a shift register formed in the circuit layer 12 of the display panel 100 together with the pixel array. The shift register of the gate driver 120 sequentially supplies a gate signal to the gate lines GL under the control of the timing controller 303. The gate signal may include a scan pulse and an EM pulse of a light emission signal. The shift register may include a scan driver which outputs a scan pulse and an EM driver which outputs an EM pulse. In FIG. 16, GVST and GCLK are gate timing signals input to the scan driver. EVST and ECLK are gate timing signals input to the EM driver.

The drive IC 300 may be connected to the host system 200, a first memory 301, and the display panel 100. The drive IC 300 may include a data receiving and calculating part 308, the timing controller 303, the data driver 306, a gamma compensation voltage generator 305, a power supply 304, and a second memory 302.

The data receiving and calculating part 308 includes a receiver for receiving pixel data which is input as a digital signal from the host system 200, and a data calculator for processing the pixel data input through the receiver to improve image quality. The data calculator may include a data restoration part for decoding and restoring compressed pixel data and an optical compensator for adding a predetermined optical compensation value to the pixel data. The optical compensation value may be set to a value for correcting brightness of the pixel data on the basis of brightness of the screen measured based on a camera image which is captured in a manufacturing process.

The timing controller 303 provides the data driver 306 with pixel data of an input image received from the host system 200. The timing controller 303 generates a gate timing signal for controlling the gate driver 120 and a source timing signal for controlling the data driver 306 to control operation timings of the gate driver 120 and the data driver 306.

The data driver 306 converts digital data including the pixel data received from the timing controller 303 through a digital-to-analog converter (DAC) into a gamma compensation voltage and outputs a data voltage Vdata1~Vdata61. The data voltage output from the data driver 306 is supplied to the data lines DL of the pixel array through an output buffer connected to data channels of the drive IC 300.

The gamma compensation voltage generator 305 divides a gamma reference voltage from the power supply 304 through a voltage divider circuit to generate a gamma compensation voltage for each gradation. The gamma compensation voltage is an analog voltage in which a voltage is set for each gradation of the pixel data. The gamma compensation voltage output from the gamma compensation voltage generator 305 is provided to the data driver 306.

The power supply 304 generates power required for driving the pixel array of the display panel 100, the gate driver 120, and the drive IC 300 using a direct current (DC)-DC converter. The DC-DC converter may include a charge pump, a regulator, a buck converter, and a boost converter. The power supply 304 may adjust a DC input voltage from the host system 200 to generate DC power such as a gamma reference voltage, the gate-on voltage VGL, the gate-off voltage VGH, a pixel driving voltage VDD, a low potential power voltage VSS, and an initialization voltage Vini. The gamma reference voltage is supplied to the gamma compensation voltage generator 305. The gate-on voltage VGL and the gate-off voltage VGH are supplied to the level shifter 307 and the gate driver 120. Pixel power, such as the pixel driving voltage VDD, the low potential power voltage VSS, and the initialization voltage Vini, is commonly supplied to the pixels P. The initialization voltage Vini is set to a DC voltage that is lower than the pixel driving voltage VDD and a threshold voltage of the light-emitting element OLED to initialize main nodes of the pixel circuits and suppress the light-emitting element OLED from emitting light.

When power is supplied to the drive IC 300, the second memory 302 stores a compensation value, register setting data, and the like which are received from the first memory 301. The compensation value may be applied to various algorithms for improving image quality. The compensation value may include an optical compensation value. The register setting data defines operations of the data driver 306, the timing controller 303, and the gamma compensation voltage generator 305. The first memory 301 may include a flash memory. The second memory 302 may include a static random access memory (SRAM).

The host system 200 may be implemented as an application processor (AP). The host system 200 may transmit pixel data of an input image to the drive IC 300 through a mobile industry processor interface (MIPI). For example, the host system 200 may be connected to the drive IC 300 through a flexible printed circuit (FPC).

The present disclosure further includes a fingerprint recognition processor. The fingerprint recognition processor 500 is connected to the photosensors S in the first sensing area SA. The fingerprint recognition processor 500 amplifies and converts output voltages of the photosensors S using an analog-to-digital converter (ADC) to generate fingerprint pattern image data. The host system 200 receives the fingerprint pattern image data from the fingerprint recognition processor 500 and performs fingerprint authentication.

Meanwhile, the display panel 100 may be implemented as a flexible panel applicable to a flexible display. A screen size of the flexible display may be varied by winding, folding, and bending a flexible display panel, and the flexible display may be easily manufactured in various designs. The flexible display may be implemented as a rollable display, a foldable display, a bendable display, a slidable display, or the like. The flexible panel may be made of a "plastic OLED panel." The plastic OLED panel may include a back plate and a pixel array on an organic thin film bonded to the back plate. A touch sensor array may be formed on the pixel array.

The back plate may be a polyethylene terephthalate (PET) substrate. A pixel array and a touch sensor array may be formed on the organic thin film. In order to reduce exposure of the pixel array from humidity, the back plate may block moisture permeation toward the organic thin film. The organic thin film may be a polyimide (PI) film substrate. A multilayer buffer film may be formed of an insulating material (not shown) on the organic thin film. The circuit layer 12, and the light-emitting element and the sensor layer 14 may be stacked on the organic thin film.

In the display device of the present disclosure, the pixel circuit, the photosensor drive circuit, and the gate driver, which are disposed in the circuit layer 12, may include a plurality of transistors. The transistors may be implemented as oxide TFTs including oxide semiconductors, low temperature poly silicon (LTPS) TFTs including LTPSs, or the like. Each of the transistors may be implemented as a p-channel TFT or an n-channel TFT. In the embodiment, the transistors of the pixel circuit are mainly described as an example implemented as p-channel TFTs, but the present disclosure is not limited thereto.

The transistor is a three-electrode element including a gate, a source, and a drain. The source is an electrode for supplying a carrier to the transistor. In the transistor, the carriers begin to flow from the source. The drain is an electrode in which the carrier is discharged from the transistor to the outside. In the transistor, the carrier flows from the source to the drain. In the case of an n-channel transistor, since the carrier is an electron, a source voltage is lower than a drain voltage so as to allow electrons to flow from the source to the drain. In the n-channel transistor, a current flows in a direction from the drain to the source. In the case of a p-channel transistor (a p-type metal oxide semiconductor (PMOS)), since the carrier is a hole, the source voltage is higher than the drain voltage so as to allow holes to flow from the source to the drain. In the p-channel transistor, since the holes flow from the source to the drain, a current flows from the source to the drain. It should be noted that the source and the drain of the transistor are not fixed. For example, the source and the drain may be changed according to an applied voltage. Therefore, the present disclosure is not limited due to the source and the drain of the transistor. In the following description, the source and the drain of the transistor will be referred to as a first electrode and a second electrode, respectively.

A gate pulse swings between a gate-on voltage and a gate-off voltage. The gate-on voltage is set to a voltage that is higher than a threshold voltage of the transistor, and the gate-off voltage is set to a voltage that is lower than the threshold voltage of the transistor. The transistor is turned on in response to the gate-on voltage, whereas the transistor is turned off in response to the gate-off voltage. In the case of the n-channel transistor, the gate-on voltage may be a gate high voltage VGH, and the gate-off voltage may be a gate low voltage VGL. In the case of the p-channel transistor, the gate-on voltage may be the gate low voltage VGL, and the gate-off voltage may be the gate high voltage VGH.

A driving element of the pixel circuit may be implemented as a transistor. The driving element should have a uniform electrical characteristic in all the pixels. However, there may be a difference between the pixels due to a process deviation and an element characteristic deviation, and an electrical characteristic may be varied with the passage of driving time of a display. In order to compensate for an electrical characteristic deviation of the driving element, the display device may include an internal compensation circuit and an external compensation circuit. The internal compensation circuit is added to the pixel circuit in each of the sub-pixels to sample a threshold voltage Vth and/or mobility μ of the driving element, which are varied according to the electrical characteristic of the driving element, and compensate for a variation in real time. The external compensation circuit transmits the threshold voltage Vth and/or the mobility u of the driving element, which are sensed through sensing lines connected to the sub-pixels, to an external compensator. A compensator of the external compensation circuit compensates for a variation in electrical characteristic of the driving element by reflecting the sensed result and modulating the pixel data of the input image. The external compensation circuit senses a voltage of the pixel, which is varied according to the electrical characteristic of the driving element, and modulates the data of the input image in an external circuit on the basis of the sensed voltage, thereby compensating for the electrical characteristic deviation of the driving element between the pixels.

Figure 18:
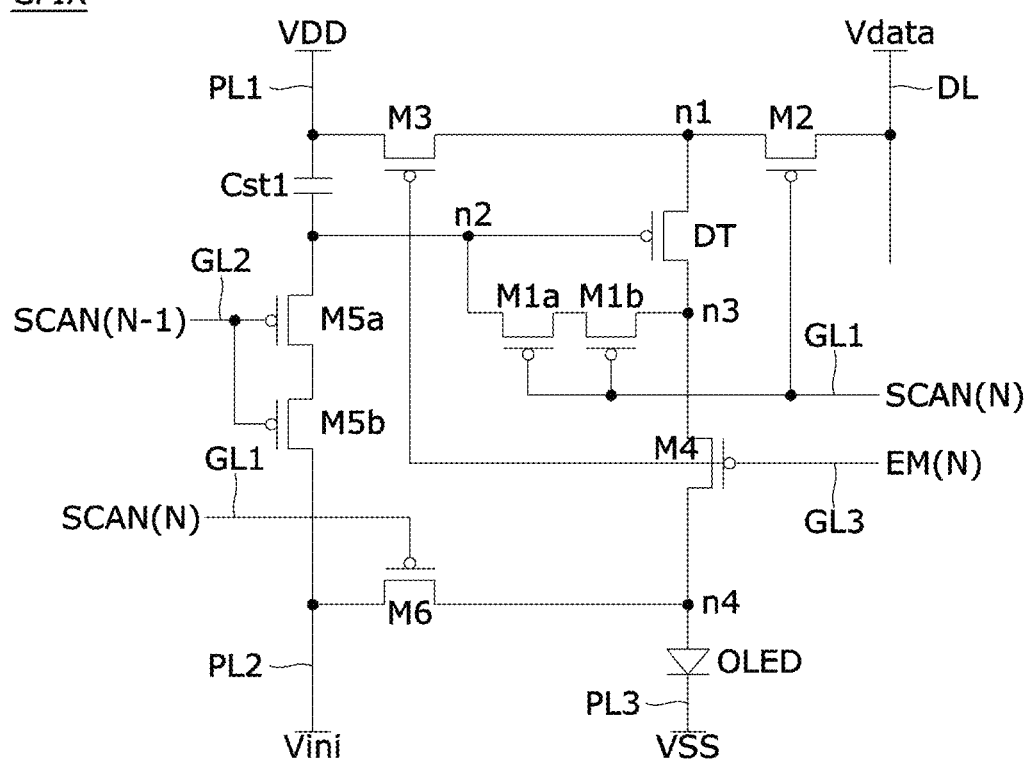
FIG. 18 is a circuit diagram illustrating another example of the pixel circuit according to an embodiment of the present disclosure.
Figure 19:
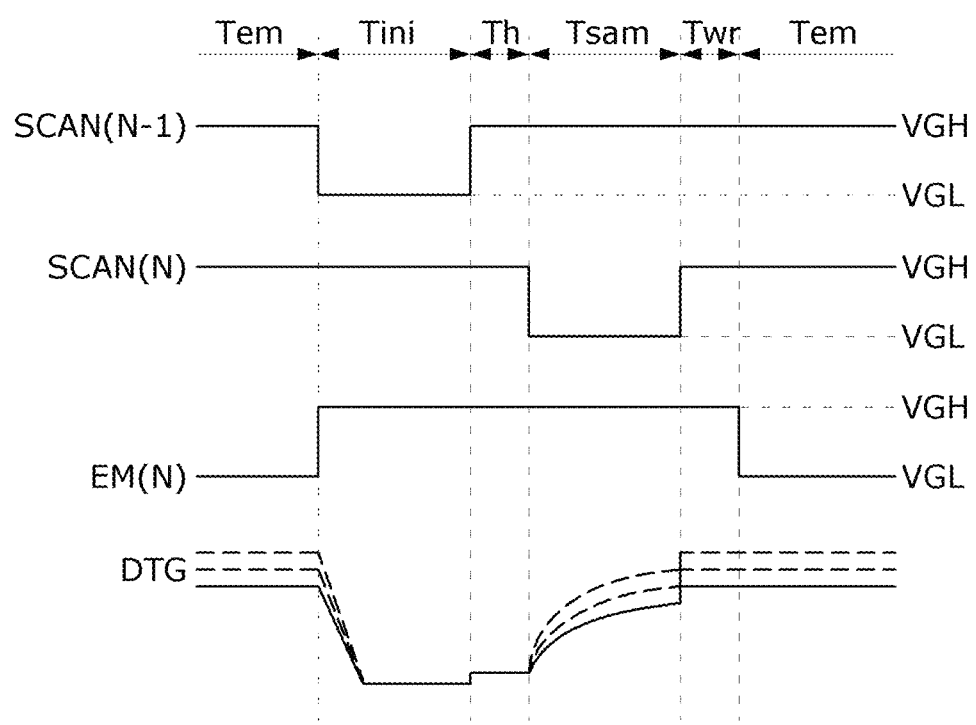
FIG. 19 is a diagram illustrating a method of driving the pixel circuits shown in FIGS. 17 and 18 according to an embodiment of the present disclosure.

FIGS. 17 and 18 are circuit diagrams illustrating an example of a pixel circuit to which an internal compensation circuit is applied according to one embodiment. FIG. 19 is a diagram illustrating a method of driving the pixel circuit shown in FIGS. 17 and 18. It should be noted that the pixel circuit of the present disclosure is not limited to FIGS. 17 to 19. The pixel circuit shown in FIGS. 17 and 18 may be equally applied to the pixel circuits of the display area DA, the first sensing area SA, and the second sensing area CA. A pixel circuit applicable to the present disclosure may be implemented as the pixel circuit shown in FIGS. 17 and 18, but the present disclosure is not limited thereto.

Referring to FIGS. 17 to 19, the pixel circuit includes a light-emitting element OLED, a driving element DT which supplies a current to the light-emitting element OLED, and an internal compensation circuit for sampling a threshold voltage Vth of the driving element DT using a plurality of switching elements M1 to M6 to compensate for a gate voltage of the driving element DT by as much as the threshold voltage Vth of the driving element DT. Each of the driving element DT and the switching elements M1 to M6 may be implemented as a p-channel TFT.

As shown in FIG. 19, a driving period of the pixel circuit using the internal compensation circuit may be divided into an initialization period Tini, a sampling period Tsam, a data writing period Twr, and a light emission period Tem.

As shown in FIG. 19, during the initialization period Tini, a (N−1)th scan signal SCAN(N−1) is generated as a pulse of the gate-on voltage VGL, and a voltage of each of an Nth scan signal SCAN(N) and a light emission signal EM(N) becomes the gate-off voltage VGH. During the sampling period Tsam, the Nth scan signal SCAN(N) is generated as a pulse of the gate-on voltage VGL, and a voltage of each of the (N−1)th scan signal SCAN(N−1) and the light emission signal EM(N) becomes the gate-off voltage VGH. During the data writing period Twr, the voltage of each of the (N−1)$^{th}$ scan signal SCAN(N−1), the N$^{th}$ scan signal SCAN(N), and the light emission signal EM(N) becomes the gate-off voltage VGH. During at least a part of the light emission period Tem, the light emission signal EM(N) is generated as the gate-on voltage VGL, and the voltage of each of the (N−1)$^{th}$ scan signal SCAN(N−1) and the N$^{th}$ scan signal SCAN(N) is generated as the gate-off voltage VGH.

During the initialization period Tini, a fifth switching element M5 is turned on according to the gate-on voltage VGL of the (N−1)th scan signal SCAN(N−1), thereby initializing the pixel circuit. During the sampling period Tsam, first and second switching elements M1 and M2 are turned on according to the gate-on voltage VGL of the N$^{th}$ scan signal SCAN(N), and a threshold voltage of the driving element DT is sampled to be charged at a capacitor Cst1. Simultaneously, a sixth switching element M6 is turned on during the sampling period Tsam to lower a voltage of a fourth node n4 to a reference voltage Vref, thereby suppressing the light-emitting element OLED from emitting light. During the data writing period Twr, the first to sixth switching elements M1 to M6 are maintained in an OFF state. During the light emission period Tem, the third and fourth switching elements M3 and M4 are turned on so that the light-emitting element OLED emits light. During the light emission period Tem, in order to precisely express brightness of a low gradation with a duty ratio of the light emission signal EM(N), the EM signal EM (N) may swing between the gate-on voltage VGL and the gate-off voltage VGH at a predetermined duty ratio to repeat an ON/OFF of the third and fourth switching elements M3 and M4.

The light-emitting element OLED may be implemented as an organic light-emitting diode or an inorganic light-emitting diode. Hereinafter, an example in which the light-emitting element OLED is implemented as an organic light-emitting diode will be described.

The light-emitting element OLED may include an organic compound layer formed between an anode and a cathode.

The organic compound layer may include a hole injection layer HIL, a hole transport layer HTL, a light emission layer EML, an electron transport layer ETL, and an electron injection layer EIL, but the present disclosure is not limited thereto. When a voltage is applied to the anode and the cathode of the light-emitting element OLED, holes passing through the hole transport layer HTL and electrons passing through the electron transport layer ETL move to the light emission layer EML to form excitons so that visible light is emitted from the light emission layer EML.

The anode of the light-emitting element OLED is connected to a fourth node n4 between the fourth and sixth switching elements M4 and M6. The fourth node n4 is connected to the anode of the light-emitting element OLED, a second electrode of the fourth switching element M4, and a second electrode of the sixth switching element M6. The cathode of the light-emitting element OLED is connected to a VSS line PL3 to which a low potential power voltage VSS is applied. The light-emitting element OLED emits light due to a current Ids flowing according to a gate-source voltage Vgs of the driving element DT. A current path of the light-emitting element OLED is switched by the third and fourth switching elements M3 and M4.

The storage capacitor Cst1 is connected between a VDD line PL1 and the second node n2. A data voltage Vdata, which is compensated for by as much as the threshold voltage Vth of the driving element DT, is charged at the storage capacitor Cst1. Since the data voltage Vdata in each sub-pixel is compensated for by as much as the threshold voltage Vth of the driving element DT, a characteristic deviation of the driving element DT in each sub-pixel is compensated for.

The first switching element M1 is turned on in response to the gate-on voltage VGL of the $N^{th}$ scan pulse or signal SCAN(N) to connect a second node n2 to a third node n3. The second node n2 is connected to a gate electrode of the driving element DT, a first electrode of the storage capacitor Cst1, and a first electrode of the first switching element M1. The third node n3 is connected to a second electrode of the driving element DT, a second electrode of the first switching element M1, and a first electrode of the fourth switching element M4. A gate electrode of the first switching element M1 is connected to a first gate line GL1 to receive the $N^{th}$ scan pulse SCAN(N). The first electrode of the first switching element M1 is connected to the second node n2, and the second electrode thereof is connected to the third node n3.

Since the first switching element M1 is turned on during only a very short one horizontal period 1H in which the $N^{th}$ scan signal SCAN(N) is generated as the gate-on voltage VGL in one frame period and thus is maintained in an OFF state during about one frame period, a leakage current may occur in an OFF state of the first switching element M1. In order to suppress the leakage current of the first switching element M1, as shown in FIG. 18, the first switching element M1 may be implemented as a transistor having a dual gate structure in which two transistors M1$a$ and M1$b$ are connected in series.

The second switching element M2 is turned on in response to the gate-on voltage VGL of the $N^{th}$ scan pulse SCAN(N) to supply the data voltage Vdata to the first node n1. The gate electrode of the second switching element M2 is connected to the first gate line GL1 to receive the $N^{th}$ scan pulse SCAN(N). The first electrode of the second switching element M2 is connected to the first node n1. The second electrode of the second switching element M2 is connected to a data line DL to which the data voltage Vdata is applied. The first node n1 is connected to the first electrode of the second switching element M2, a second electrode of the third switching element M3, and the first electrode of the driving element DT.

The third switching element M3 is turned on in response to the gate-on voltage VGL of the light emission signal EM(N) to connect the VDD line PL1 to the first node n1. A gate electrode of the third switching element M3 is connected to a third gate line GL3 to receive the light emission signal EM(N). A first electrode of the third switching element M3 is connected to the VDD line PL1. The second electrode of the second switching element M3 is connected to the first node n1.

The fourth switching element M4 is turned on in response to the gate-on voltage VGL of the light emission signal EM(N) to connect the third node n3 to the anode of the light-emitting element OLED. A gate electrode of the fourth switching element M4 is connected to the third gate line GL3 to receive the light emission signal EM(N). The first electrode of the fourth switching element M4 is connected to the third node n3, and the second electrode thereof is connected to the fourth node n4.

The fifth switching element M5 is turned on in response to the gate-on voltage VGL of the $(N-1)^{th}$ scan pulse SCAN(N−1) to connect the second node n2 to the Vini line PL2. A gate electrode of the fifth switching element M5 is connected to a second gate line GL2 to receive the $(N-1)^{th}$ scan pulse SCAN(N−1). A first electrode of the fifth switching element M5 is connected to the second node n2, and a second electrode thereof is connected to the Vini line PL2. In order to suppress a leakage current of the fifth switching element M5, as shown in FIG. 18, the fifth switching element M5 may be implemented as a transistor having a dual gate structure in which two transistors M5$a$ and M5$b$ are connected in series.

The sixth switching element M6 is turned on in response to the gate-on voltage VGL of the $N^{th}$ scan pulse SCAN(N) to connect the *Vini* line PL2 to the fourth node n4. A gate electrode of the sixth switching element M6 is connected to the first gate line GL1 to receive the $N^{th}$ scan pulse SCAN(N). A first electrode of the sixth switching element M6 is connected to the Vini line PL2, and a second electrode thereof is connected to the fourth node n4.

The driving element DT controls the current Ids flowing in the light-emitting element OLED according to the gate-source voltage Vgs, thereby driving the light-emitting element OLED. The driving element DT includes a gate connected to the second node n2, the first electrode connected to the first node n1, and the second electrode connected to the third node n3.

During the initialization period Tini, the $(N-1)^{th}$ scan signal SCAN(N−1) is generated as the gate-on voltage VGL. During the initialization period Tini, the $N^{th}$ scan signal SCAN(N) and the light emission signal EM(N) are maintained at the gate-off voltage VGH. Thus, during the initialization period Tini, the fifth switching element M5 is turned on so that the second and fourth nodes n2 and n4 are initialized at the initialization voltage Vini. A hold period Th may be set between the initialization period Tini and the sampling period Tsam. During the hold period Th, the gate pulses or signals SCAN(N−1), SCAN(N), and EM(N) are maintained in previous states thereof.

During the sampling period Tsam, the Nth scan pulse SCAN(N) is generated as the gate-on voltage VGL. A pulse of the Nth scan pulse SCAN(N) is synchronized with a data voltage Vdata of an Nth pixel line. During the sampling period Tsam, the (N−1)th scan pulse SCAN(N−1) and the light emission signal EM(N) are maintained at the gate-off voltage VGH. Therefore, during the sampling period Tsam, the first and second switching elements M1 and M2 are turned on.

During the sampling period Tsam, a gate voltage DTG of the driving element DT rises due to a current flowing through the first and second switching elements M1 and M2. When the driving element DT is turned off, the voltage of the gate node or gate voltage DTG becomes Vdata-|Yth|. In this case, a voltage of the first node n1 also becomes Vdata-|Yth|. During the sampling period Tsam, the gate-source voltage Vgs of the driving element DT becomes |Vgs|=Vdata-(Vdata-|Vth|)=|Vth|.

During the data writing period Twr, the $N^{th}$ scan pulse SCAN(N) is reversed to the gate-off voltage VGH. During the data writing period Twr, the $(N-1)^{th}$ scan pulse SCAN(N-1) and the light emission signal EM(N) are maintained at the gate-off voltage VGH. Therefore, during the data writing period Twr, all the switching elements M1 to M6 are maintained in the OFF state.

During the light emission period Tem, the light emission signal EM(N) may be generated as the gate-on voltage VGL. During the light emission period Tem, in order to improve a low gradation expression, the light emission signal EM(N) may be turned on or off at a predetermined duty ratio to swing between the gate-on voltage VGL and the gate-off voltage VGH. Accordingly, the light emission signal EM(N) may be generated as the gate-on voltage VGL during at least a partial period of the light emission period Tem.

When the light emission signal EM(N) is the gate-on voltage VGL, a current flows between a VDD and the light-emitting element OLED so that the light-emitting element OLED may emit light. During the light emission period Tem, the $N^{th}$ scan pulse SCAN(N) and the $(N-1)^{th}$ scan pulse SCAN(N-1) are maintained at the gate-off voltage VGH. During the light emission period Tem, the third and fourth switching elements M3 and M4 are repeatedly turned on and off according to a voltage of the light emission signal EM(N). When the light emission signal EM(N) is the gate-on voltage VGL, the third and fourth switching elements M3 and M4 are turned on so that a current flows in the light-emitting element OLED. In this case, Vgs of the driving element DT becomes |Vgs|=VDD-(Vdata-|Vth|), and the current flowing in the light-emitting element OLED is $K(VDD-Vdata)^2$. K is a constant value determined by charge mobility, parasitic capacitance, and a channel capacity of the driving element DT.

Figure 20:
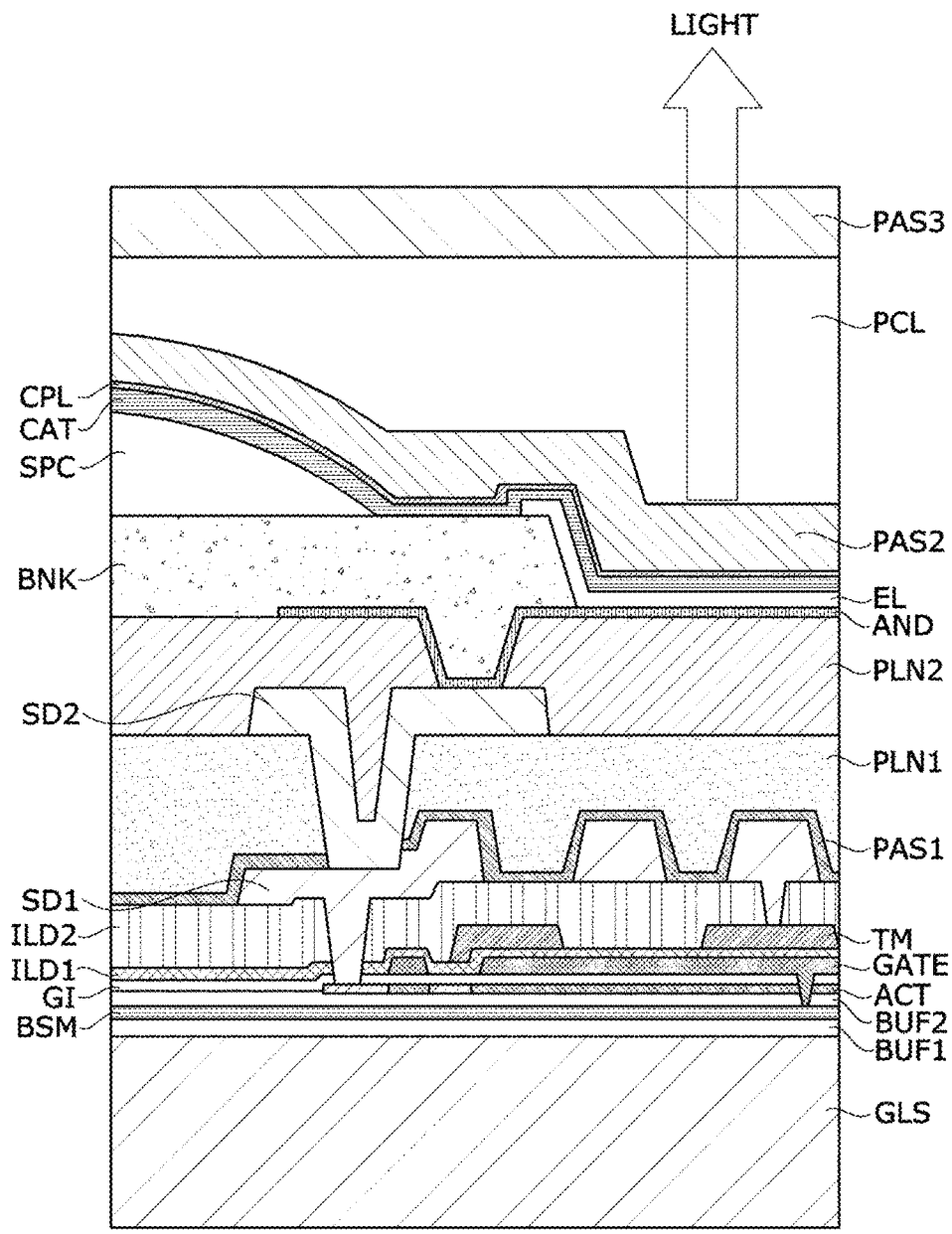
FIG. 20 is a detailed cross-sectional view illustrating a cross-sectional structure of a display panel according to one embodiment of the present disclosure.

FIG. 20 is a detailed cross-sectional view illustrating a cross-sectional structure of a display panel according to one embodiment of the present disclosure. It should be noted that the cross-sectional structure of the display panel is not limited to FIG. 20.

Referring to FIG. 20, a circuit layer, a light-emitting element layer, and an encapsulation layer may be stacked on a substrate GLS.

A first buffer layer BUF1 may be formed on the substrate GLS. A first metal layer may be formed on the first buffer layer BUF1, and a second buffer layer BUF2 may be formed on the first metal layer. The first metal layer is patterned in a photolithography process. The first metal layer may include a bottom shield pattern BSM. The bottom shield pattern BSM blocks external light so as to prevent an active layer of a TFT from being irradiated with light. Each of the first and second buffer layers BUF1 and BUF2 may be made of an inorganic insulating material and may be formed of one or more insulating layers.

An active layer ACT may be formed of a semiconductor material, for example, a-Si, deposited on the second buffer layer BUF2 and may be patterned by a photolithography process. The active layer ACT includes active patterns of each of TFTs of the pixel circuit and a TFT of a gate driver. A partial portion of the active layer ACT may be metallized by ion doping. The metallized portion may be used as a jumper pattern connecting metal layers at some nodes of the pixel circuit to connect components of the pixel circuit.

A gate insulating layer GI may be formed on the active layer ACT. The gate insulating layer GI may be made of an inorganic insulating material. A second metal layer may be formed on the second gate insulating layer GI. The second metal layer may be patterned by a photolithography process. The second metal layer may include a gate line, a gate electrode pattern GATE, a lower electrode of the storage capacitor Cst1, and a jumper pattern connecting patterns of the first metal layer and a third metal layer.

A first interlayer insulating layer ILD1 may cover the second metal layer. A third metal layer may be formed on the first interlayer insulating layer ILD1, and a second interlayer insulating layer ILD2 may cover the third metal layer. The third metal layer may be patterned by a photolithography process. The third metal layer may include metal patterns TM such as an upper electrode of the storage capacitor Cst1 and a third power line. The first and second interlayer insulating layers ILD1 and ILD2 may include an inorganic insulating material.

A fourth metal layer may be formed on the second interlayer insulating layer ILD2, and an inorganic insulating layer PAS1 and a first planarization layer PLN1 may be stacked on the fourth metal layer. A fifth metal layer may be formed on the first planarization layer PLN1.

Some metal patterns of the fourth metal layer may be connected to the fifth metal layer through a contact hole passing through the first planarization layer PLN1 and the inorganic insulating layer PAS1. The first and second planarization layers PLN1 and PLN2 may be made of an organic insulating material which planarizes a surface.

The fourth metal layer may include first and second electrodes of the TFT connected to the active pattern of the TFT through a contact hole passing through the second interlayer insulating layer ILD2. A data line DL and power lines PL1, PL2, and PL3 may be implemented as a pattern SD1 of the fourth metal layer or a pattern SD2 of the fifth metal layer.

An anode electrode AND of a light-emitting element OLED may be formed on the second planarization layer PLN2. The anode electrode AND may be connected to an electrode of the TFT used as a switching element or a driving element through a contact hole passing through the second planarization layer PLN2. The anode electrode AND may be made of a transparent or translucent electrode material.

A pixel defining layer BNK may cover the anode electrode AND of the light-emitting element OLED. The pixel defining layer BNK is formed as a pattern defining a light-emitting area (or an opening area) through which light passes from each of the pixels to the outside. A spacer SPC may be formed on the pixel defining layer BNK. The pixel defining layer BNK and spacer SPC may be integrated using the same organic insulating material. The spacer SPC secures a gap between a fine metal mask (FMM) and the anode electrode AND so as to prevent the FMM from being in contact with the anode electrode AND in a deposition process of an organic compound EL.

The organic compound layer is formed in the light-emitting area of each of the pixels defined by the pixel defining layer BNK. A cathode electrode CAT of the light-emitting element OLED is formed on an entire surface of the display panel 100 to cover the pixel defining layer BNK, the spacer SPC, and the organic compound EL. The cathode electrode CAT may be connected to a VSS line PL3 which is formed of any one among the metal layers below the cathode electrode CAT. A capping layer CPL may cover the cathode electrode CAT. The capping layer CPL is formed of an inorganic insulating material, and the capping layer CPL blocks infiltration of air and out gassing of an organic insulating material applied on the capping layer CPL, thereby protecting the cathode electrode CAT. An inorganic insulating layer PAS2 may cover the capping layer CPL, and a planarization layer PCL may be formed on the inorganic insulating layer PAS2. The planarization layer PCL may include an organic insulating material. An inorganic insulating layer PASS of the encapsulation layer may be formed on the planarization layer PCL.

In the first sensing area SA, the active layer ACT-OPD of the organic photodiode OPD may be formed coplanar with the organic compound layer of the sub-pixel and between the anode electrode AND and the cathode electrode CAT.

The circuit layer 12 of the first sensing area SA may be implemented in a structure similar to a structure of the pixel circuit shown in FIG. 20. Thus, as shown in FIGS. 23 to 25G, the photosensor drive circuit may be implemented in a structure in which at least one of the lines are shared with the pixel circuit or pixel drive circuit.

Figure 21:
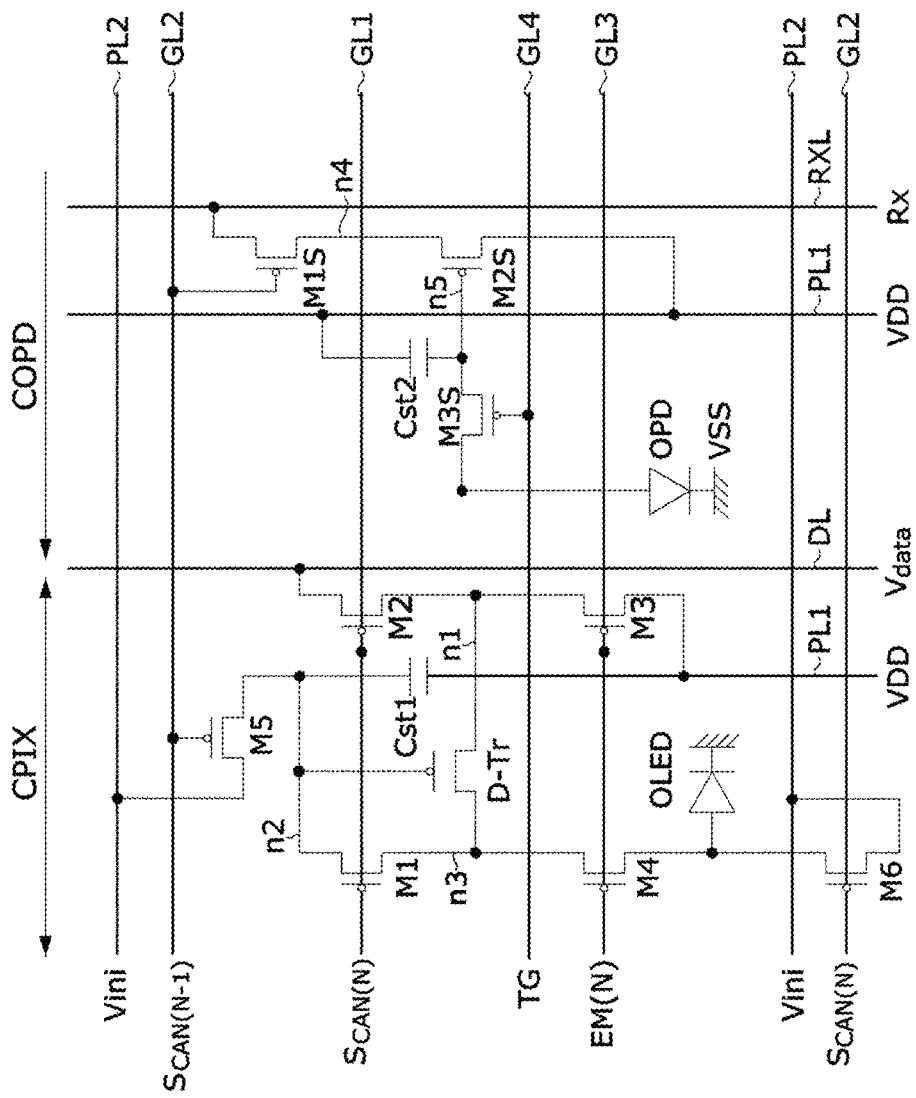
FIGS. 21 and 22 are equivalent circuit diagrams illustrating a line sharing structure of a pixel circuit and a photosensor drive circuit according to one embodiment of the present disclosure.
Figure 22:
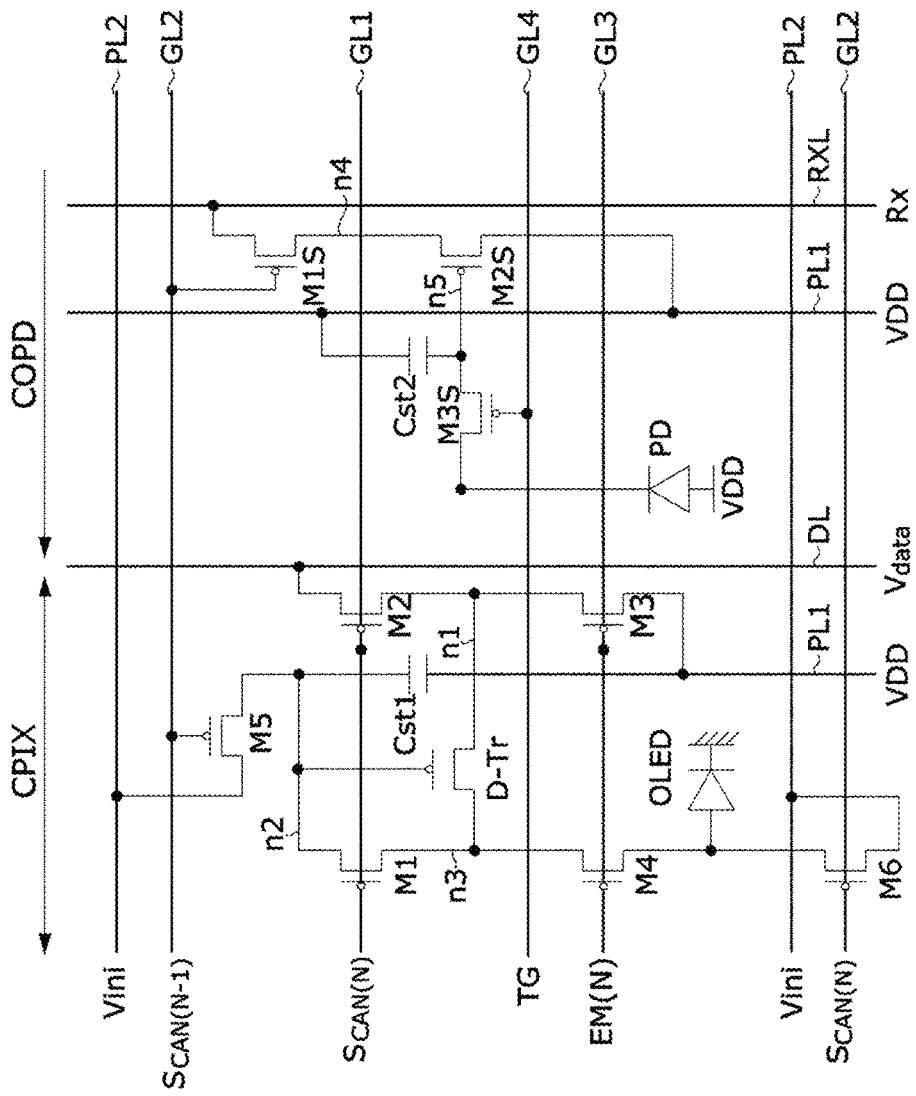

FIGS. 21 and 22 are equivalent circuit diagrams illustrating a line sharing structure of the pixel circuit CPIX and the photosensor drive circuits COPD of the first sensing area SA according to one embodiment of the present disclosure. In FIGS. 21 and 22, the pixel circuit is substantially the same as the pixel circuit shown in FIG. 17, and thus a detailed description thereof will be omitted herein. The photosensor drive circuit may be implemented as the circuits shown in FIGS. 21 and 22, but the present disclosure is not limited thereto.

FIG. 21 illustrates an example in which the photosensor S is implemented as the organic photodiode OPD so that the anode electrode, the cathode electrode, the gate line, and the power line are shared in the pixel circuit and the photosensor drive circuit.

Referring to FIG. 21, the photosensor drive circuit COPD drives the organic photodiode OPD and outputs a signal Rx which is photoelectrically converted by the organic photodiode OPD. The signal Rx, which is photoelectrically converted by the organic photodiode OPD, may be transmitted to the fingerprint recognition processor 500 through an RX line RXL.

The photosensor drive circuit COPD is connected to the VDD line PL1, the VSS line PL3, the second to fourth gate lines GL2 to GL4, and the Rx line RXL. The second to fourth gate lines GL2 to GL4 may be formed as parallel lines on the pixel array. The Rx line RXL may be formed as a line parallel to the data line DL and the VDD line PL1.

The photosensor drive circuit COPD includes first-S to third-S switching elements M1S to M3S and a capacitor Cst2. Each of the first-S to third-S switching elements M1S to M3S may be implemented as a p-channel TFT.

The organic photodiode OPD includes an anode electrode connected to the third-S switching element M3S, a cathode electrode to which a low potential power voltage VSS is applied, and an active layer formed between the anode electrode and the cathode electrode. The active layer of the organic photodiode OPD includes an organic semiconductor material. When a reverse bias voltage is applied, the organic photodiode OPD generates a current according to received light to generate a photoelectrically converted signal Rx.

The capacitor Cst2 is connected between the VDD line PL1 and a gate electrode of a second-S switching element M2S connected to the fifth node n5. When the third-S switching element M3S is turned on, the capacitor Cst2 is charged with charge from the organic photodiode OPD to store a voltage of the photoelectrically converted signal Rx. An exposure time of the photosensor S is determined according to a pulse width of an exposure signal TG which is applied to a gate electrode of the third-S switching element M3S. As the pulse width of the exposure signal TG is increased, an amount of charge with which the capacitor Cst2 is charged may be increased due to the photosensor S.

The first-S switching element M1S is turned on in response to the gate-on voltage VGL of the $(N-1)^{th}$ scan signal SCAN(N-1) to connect the fourth node n4 to the Rx line RXL. The fourth node n4 is connected to a second electrode of the first-S switching element M1S and a first electrode of the second-S switching element M2S. A gate electrode of the first-S switching element M1S is connected to the second gate line GL2 to receive the $(N-1)^{th}$ scan pulse SCAN(N-1). A first electrode of the first-S switching element M1S is connected to the Rx line RXL, and the second electrode of the first-S switching element M1S is connected to the fourth node n4.

The second-S switching element M2S adjusts an amount of current flowing between the VDD line PL1 and the fourth node n4 through the Rx line RXL according to a gate voltage, that is, a voltage of the fifth node n5. The second-S switching element M2S includes a gate electrode connected to the second node n5, the first electrode connected to the fourth node n4, and a second electrode connected to the VDD line PL1. The fifth node n5 is connected to a second electrode of the third-S switching element M3S, the capacitor Cst2, and the gate electrode of the second-S switching element M2S.

The third-S switching element M3S is turned on in response to the gate-on voltage VGL of the exposure signal TG to connect the anode electrode of the organic photodiode OPD to the fifth node n5. In this case, the charge from the organic photodiode OPD is charged at the capacitor Cst2. The third-S switching element M3S includes the gate electrode connected to the fourth gate line GL4 to which the exposure signal TG is applied, a first electrode connected to the anode electrode of the organic photodiode OPD, and a second electrode connected to the fifth node n5.

As shown in FIG. 7, the anode electrodes of the organic photodiode OPD and the light-emitting element OLED may be formed on the same layer, and the cathode electrodes of the organic photodiode OPD and the light-emitting element OLED may be formed on the same layer. In this case, when the anode electrode of the organic photodiode OPD is connected to the third-S switching element M3S, since the organic photodiode OPD may be connected to the photosensor drive circuit COPD without an additional line, a structure of the display panel 100 may be simplified.

FIG. 22 illustrates an example in which the photosensor S is implemented as the inorganic photodiode PD so that the gate line and the power line are shared in the pixel circuit and the photosensor drive circuit. In the circuit shown in FIG. 22, detailed descriptions of components which are substantially the same as those of the circuit shown in FIG. 21 will be omitted herein.

Referring to FIG. 22, the photosensor drive circuit COPD drives the inorganic photodiode PD and outputs a signal Rx which is photoelectrically converted by the inorganic photodiode PD. The signal Rx, which is photoelectrically converted by the inorganic photodiode PD, may be transmitted to the fingerprint recognition processor 500 through the Rx line RXL.

The inorganic photodiode PD includes an anode electrode connected to the VDD line PL1, a cathode electrode connected to the third-S switching element M3S, and an active layer formed between the anode electrode and the cathode electrode. The active layer of the inorganic photodiode PD includes an inorganic semiconductor material. When a reverse bias voltage is applied, the inorganic photodiode PD generates a current according to received light to generate the photoelectrically converted signal Rx.

The third-S switching element M3S is turned on in response to the gate-on voltage VGL of the exposure signal TG to connect the cathode electrode of the inorganic photodiode PD to the fifth node n5. In this case, charge from the inorganic photodiode PD is charged at the capacitor Cst2. The third-S switching element M3S includes a gate electrode connected to the fourth gate line GL4, a first electrode connected to the cathode electrode of the inorganic photodiode PD, and a second electrode connected to the fifth node n5.

Figure 23:
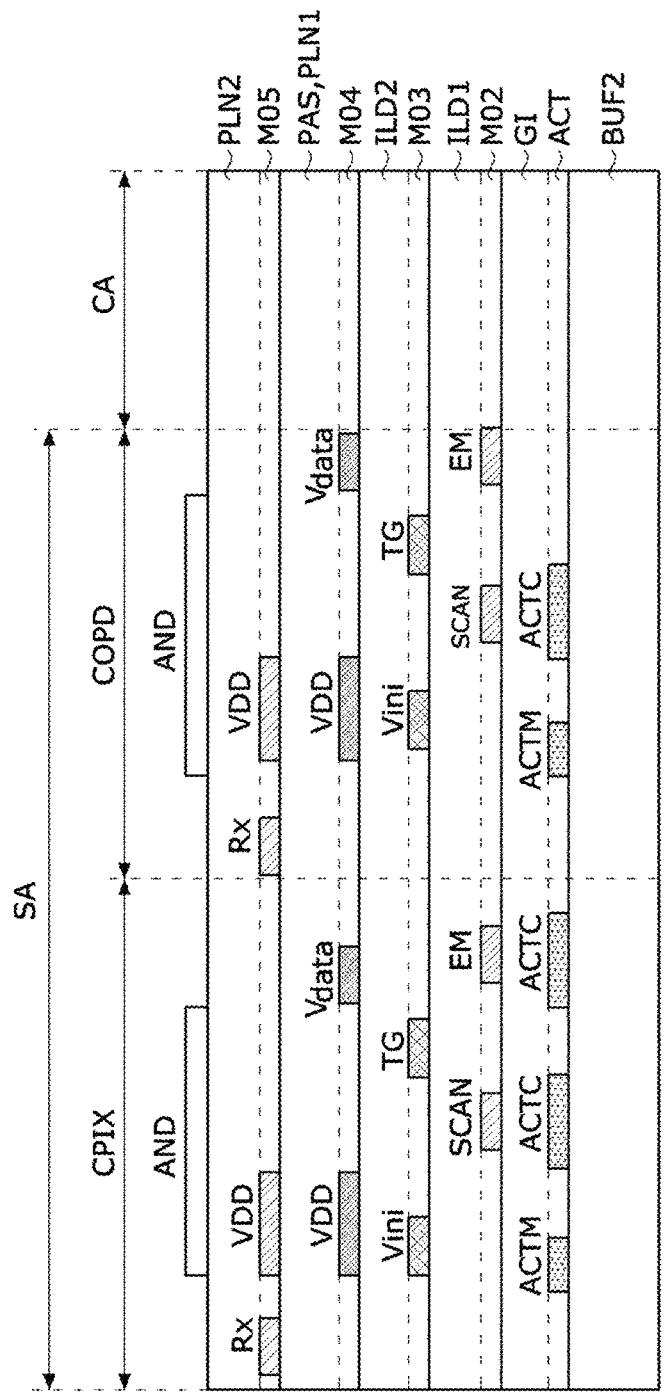
FIG. 23 is a diagram illustrating metal layers of the pixel circuit and the photosensor drive circuit according to an embodiment of the present disclosure.

FIG. 23 is a diagram illustrating metal layers of the pixel circuit CPIX and the photosensor drive circuit COPD. In FIG. 23, a first metal layer is omitted. Cross-sectional structures of the pixel circuit CPIX and the photosensor drive circuit COPD are not limited to FIG. 23. In FIG. 23, GI, ILD1, ILD2, PAS, PLN1, and PLN2 are insulating layers which insulate between an active layer ACT, a second metal layer M02, and metal layers.

Referring to FIG. 23, the active layer ACT includes a semiconductor pattern ACTC having a semiconductor pattern ACTM which is partially metallized by ion doping. The semiconductor pattern ACTC includes an active pattern of each TFT.

The second metal layer M02 may be patterned as gate lines to which a scan pulse and an EM pulse are applied. A third metal layer M03 may be patterned as a Vini line PL3 to which Vini is applied and a gate line to which the exposure signal TG is applied. A fourth metal layer M04 may be patterned as a VDD line PL1 to which VDD is applied and a data line to which the data voltage Vdata is applied. A fifth metal layer M05 may be patterned as the VDD line PL1 to which the VDD is applied, and an Rx line RXL through which a signal Rx, which is photoelectrically converted by the organic photodiode OPD, is output. Lines to which the same signal or the same power voltage is applied among metal layers may be connected through a jumper pattern and a contact hole.

The storage capacitor Cst1 of the pixel circuit may be formed between one pattern of the second metal layer M02 and one pattern of the third metal layer M03, which overlap each other. The storage capacitor Cst2 of the photosensor drive circuit may be formed between the metallized semiconductor pattern ACTM and the one pattern of the third metal layer M03, which overlap each other.

The pixel circuits are disposed in the display area DA and the sensing areas SA and CA, and the photosensor drive circuit COPD is further disposed in the first sensing area SA. The fourth gate line GL4 to which the exposure signal TG is applied may cross the display area DA and the first sensing area SA to be connected to the photosensor drive circuit COPD. The Rx line RXL may cross the display area DA or cross the display area DA and the second sensing area CA to be connected to the photosensor drive circuit COPD.

FIG. 23 illustrates an example in which the fourth gate line GL4 to which the exposure signal TG is applied is formed as a pattern of the third metal layer M03, but the present disclosure is not limited thereto. For example, the fourth gate line GL4 may be formed as a pattern of the second metal layer M02 or the third metal layer M03.

FIG. 23 illustrates an example in which the Rx line RXL is formed as a pattern of the fifth metal layer M05, but the present disclosure is not limited thereto. For example, the Rx line RXL may be formed as a pattern of the fourth metal layer M04 or the fifth metal layer M05.

Figure 24:
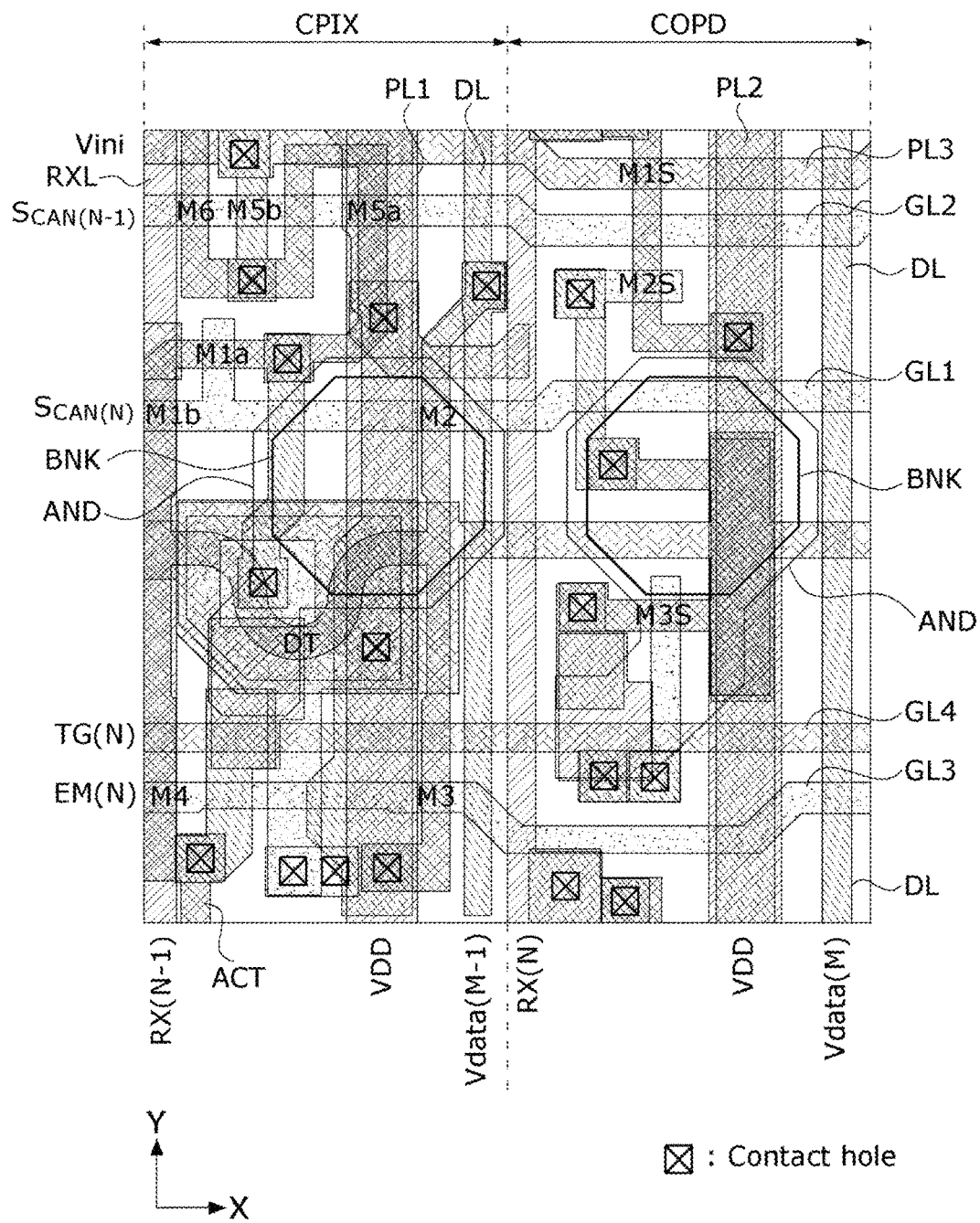
FIG. 24 is a detailed plan view illustrating layouts of the pixel circuit and the photosensor drive circuit according to an embodiment of the present disclosure.

FIG. 24 is a detailed plan view illustrating layouts of the pixel circuit and the photosensor drive circuit according to one embodiment. FIGS. 25A to 25G are plan views illustrating a pattern shape of each layer by separating main layers from the layouts of the pixel circuit and the photosensor drive circuit which are shown in FIG. 24. In FIG. 24, RX(N−1) and RX(N) are photoelectrically converted signals applied to RX lines RXL. Vdata(M−1) and Vdata are data voltage applied to data lines DL.

Figure 25A:
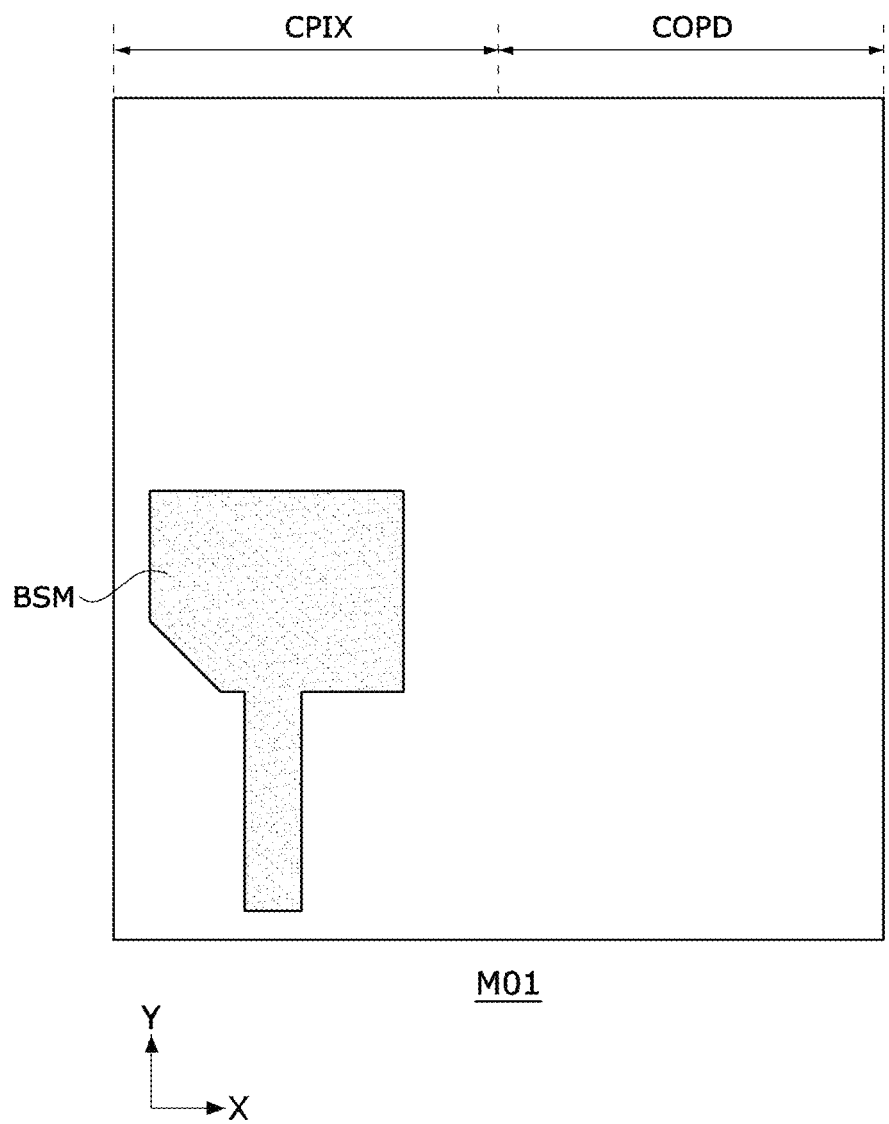
FIGS. 25A to 25G are plan views illustrating a pattern shape of each layer by separating main layers from the layouts of the pixel circuit and the photosensor drive circuit which are shown in FIG. 24 according to an embodiment of the present disclosure.
Figure 25B:
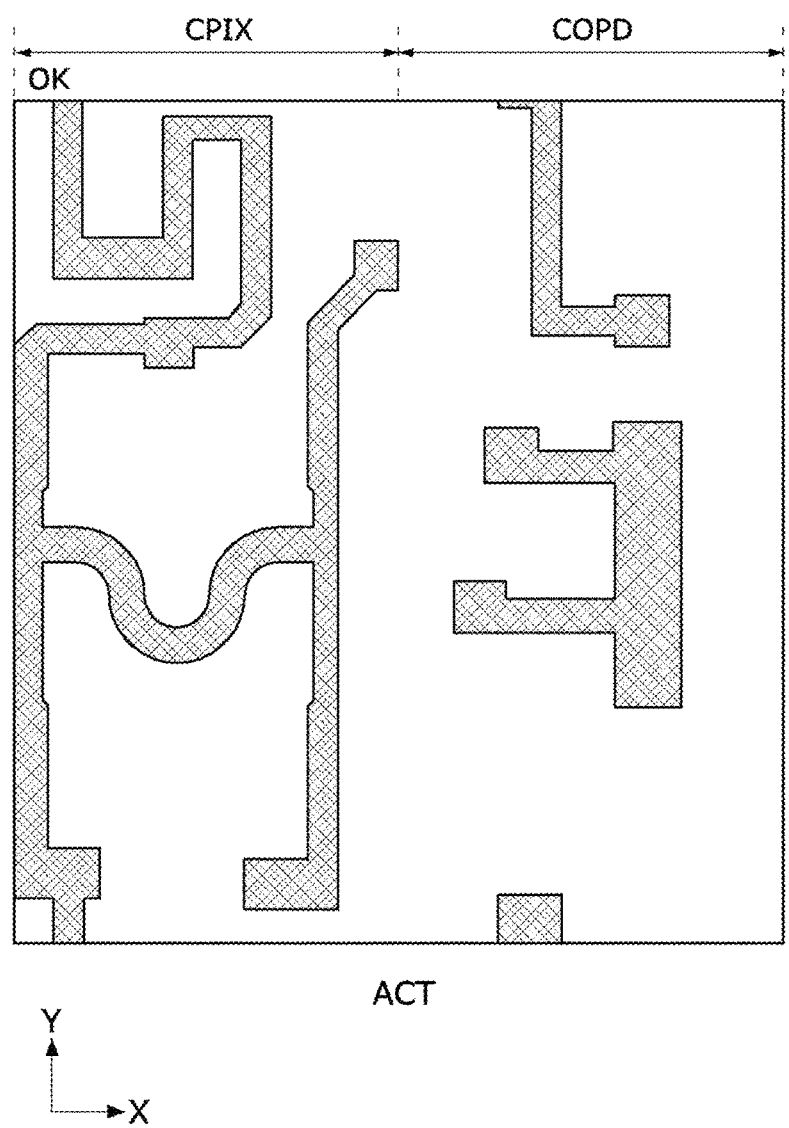

The first metal layer M01 may be patterned in a shape as shown in FIG. 25A. The first metal layer M01 may include the bottom shield pattern BSM overlapping the active pattern of the TFT in the pixel circuit CPIX. The active layer ACT may be patterned in a shape as shown in FIG. 25B. The active layer ACT includes active patterns and metallized patterns of the TFTs in the pixel circuit CPIX and the photosensor drive circuit COPD.

Figure 25C:
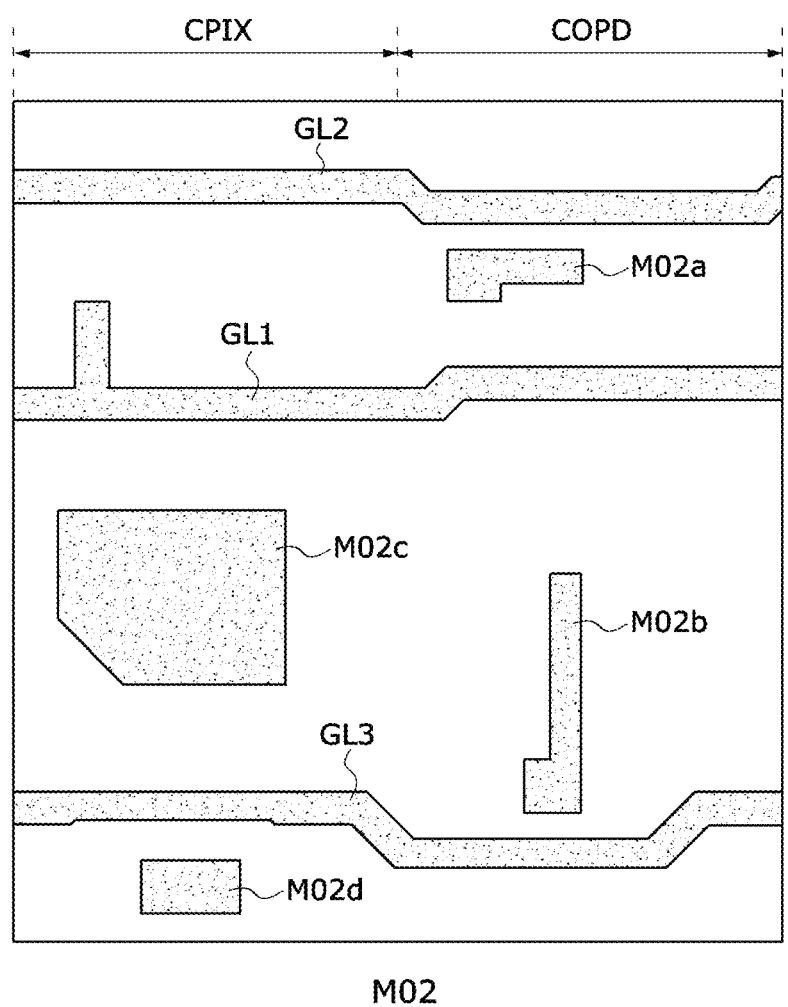

The second metal layer M02 may be patterned in a shape as shown in FIG. 25C. The second metal layer M02 may include the gate lines GL1, GL2, GL3 to which scan pulses and EM pulses are applied, the gate electrode of the TFT, a lower electrode M02c of the first storage capacitor Cst1, and jumper patterns M02a, M02b, and M02d. The jumper patterns M02a and M02b are used to connect the metal layers through contact holes.

Figure 25D:
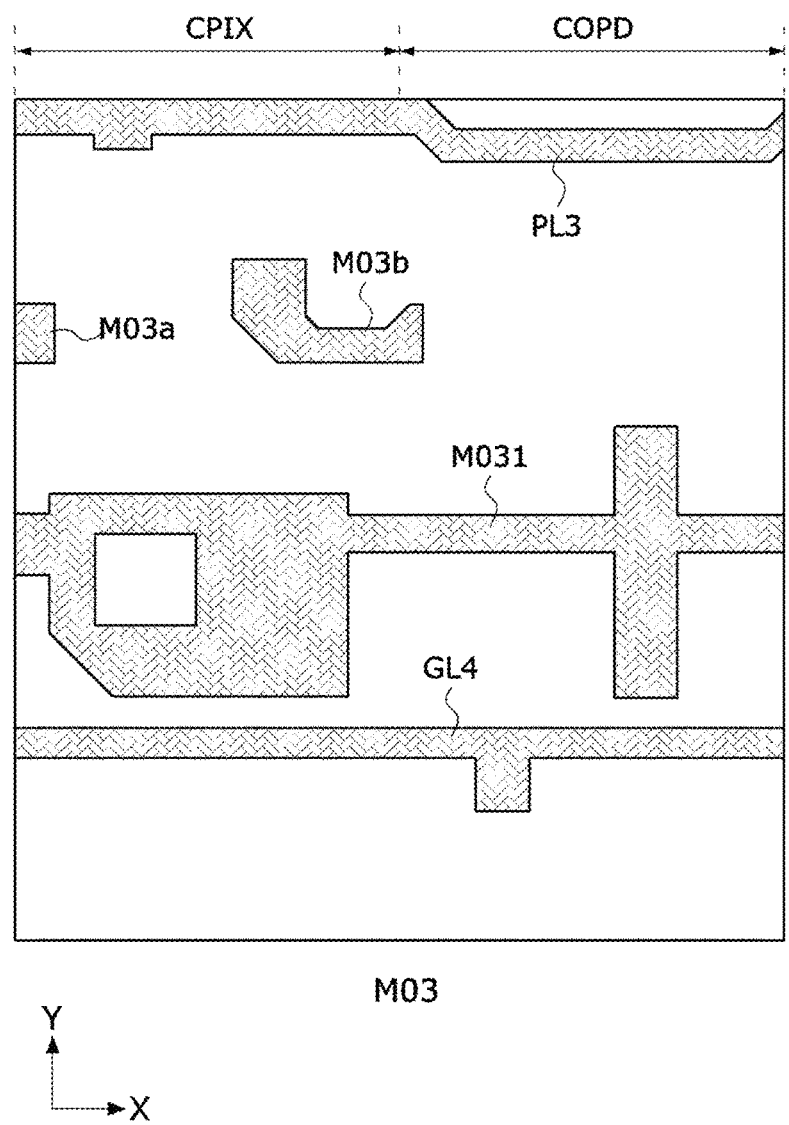

The third metal layer M03 may be patterned in a shape as shown in FIG. 25D. The third metal layer M03 may include a pattern M031 in which an upper electrode of the first storage capacitor Cst1 and a lower electrode of the second storage capacitor Cst2 are integrated, the Vini line PL3, the fourth gate line GL4, and jumper patterns M03a and M03b.

Figure 25E:
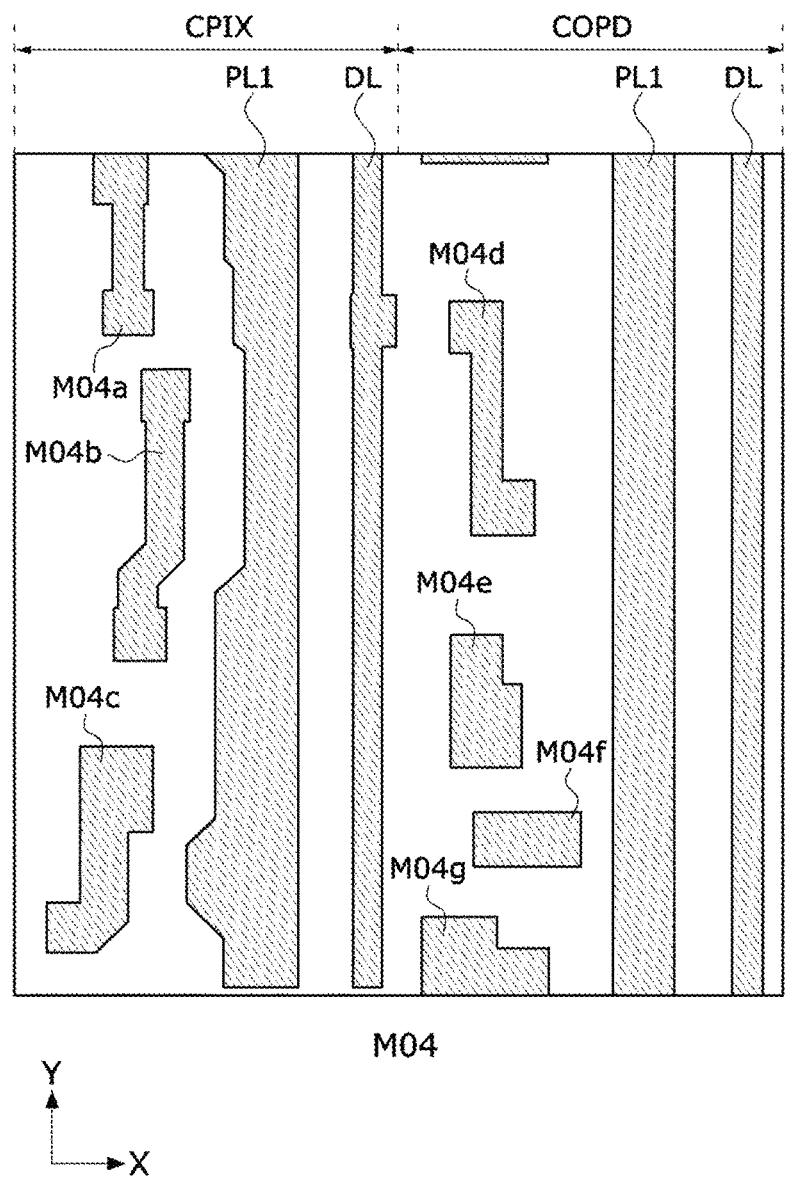

The fourth metal layer M04 may be patterned in a shape as shown in FIG. 25E. The fourth metal layer M04 may include the VDD lines PL1, the data lines DL, and jumper patterns M04a to M04g. An upper electrode of the second storage capacitor Cst2 may be integrated with the VDD lines PL1 of the fourth metal layer M04.

Figure 25F:
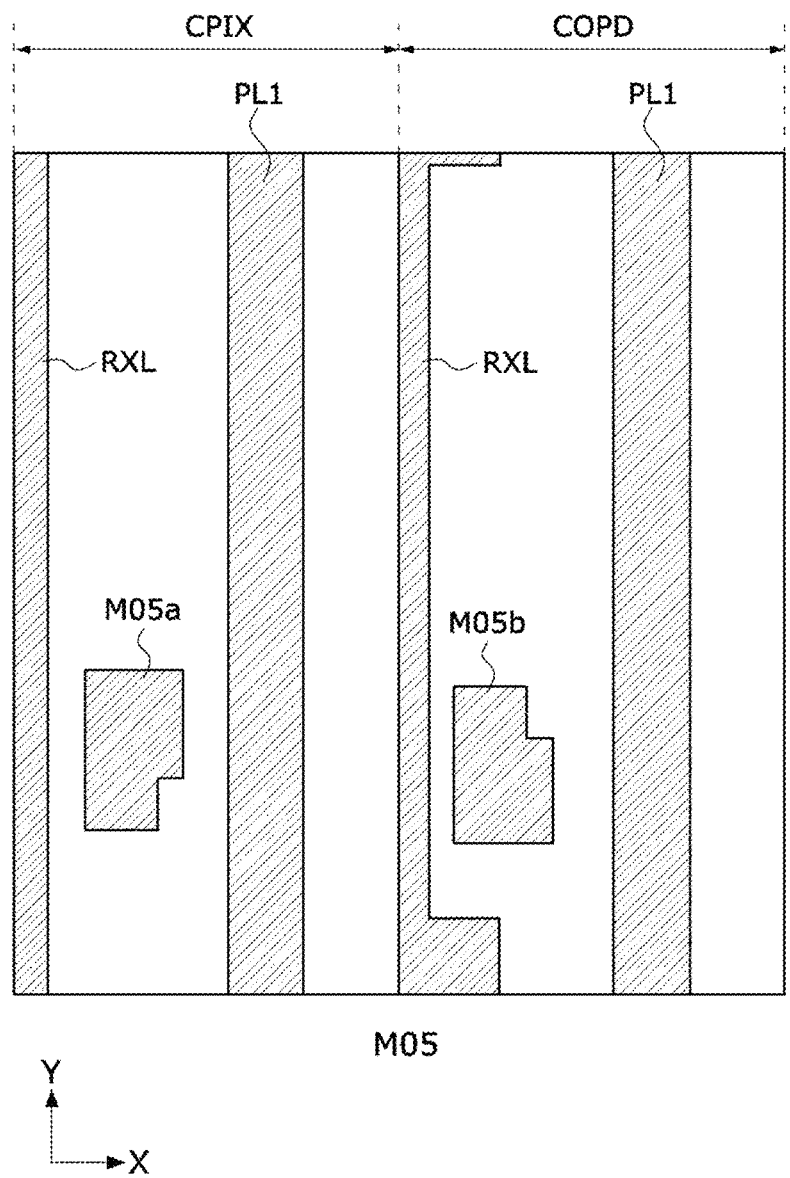
Figure 25G:
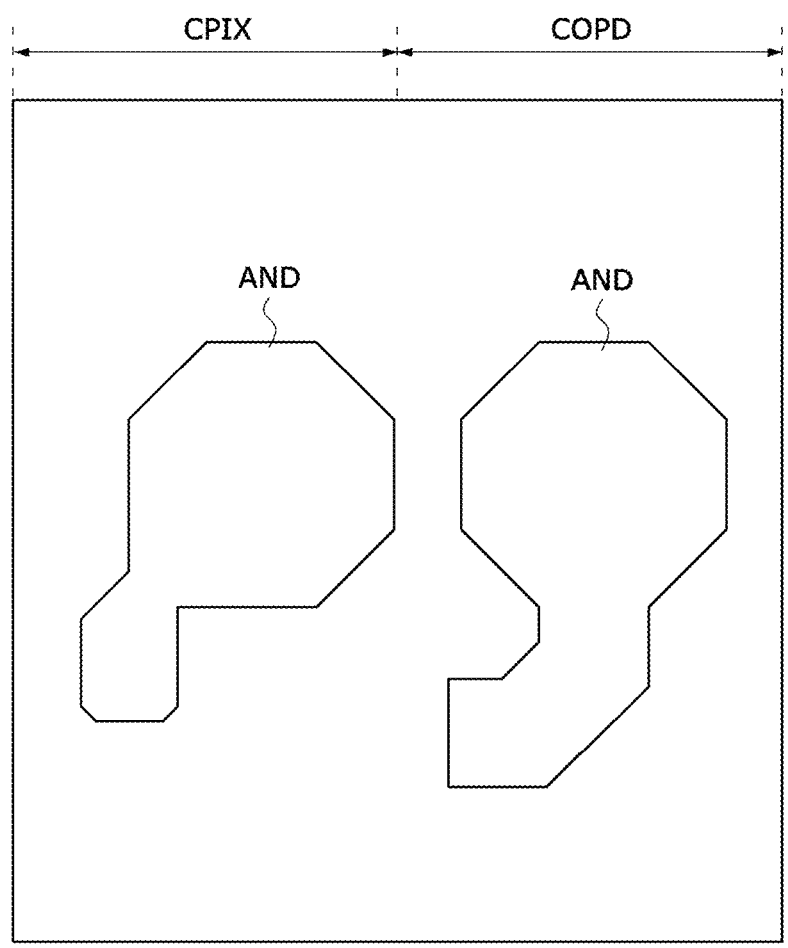

The fifth metal layer M05 may be patterned in a shape as shown in FIG. 25F. The fifth metal layer M05 may include the VDD lines PL1, the Rx lines RXL, and jumper patterns M05a and M05b. The anode electrodes AND of the pixel circuit CPIX and the photosensor drive circuit COPD may be patterned in shapes as shown in FIG. 25G. The anode electrode AND of the pixel circuit CPIX is formed coplanar with the anode electrode AND of the photosensor drive circuit COPD.

As shown in FIGS. 23 to 25G, the pixel circuit CPIX and the photosensor drive circuit COPD share the gate lines and the power lines.

Figure 26:
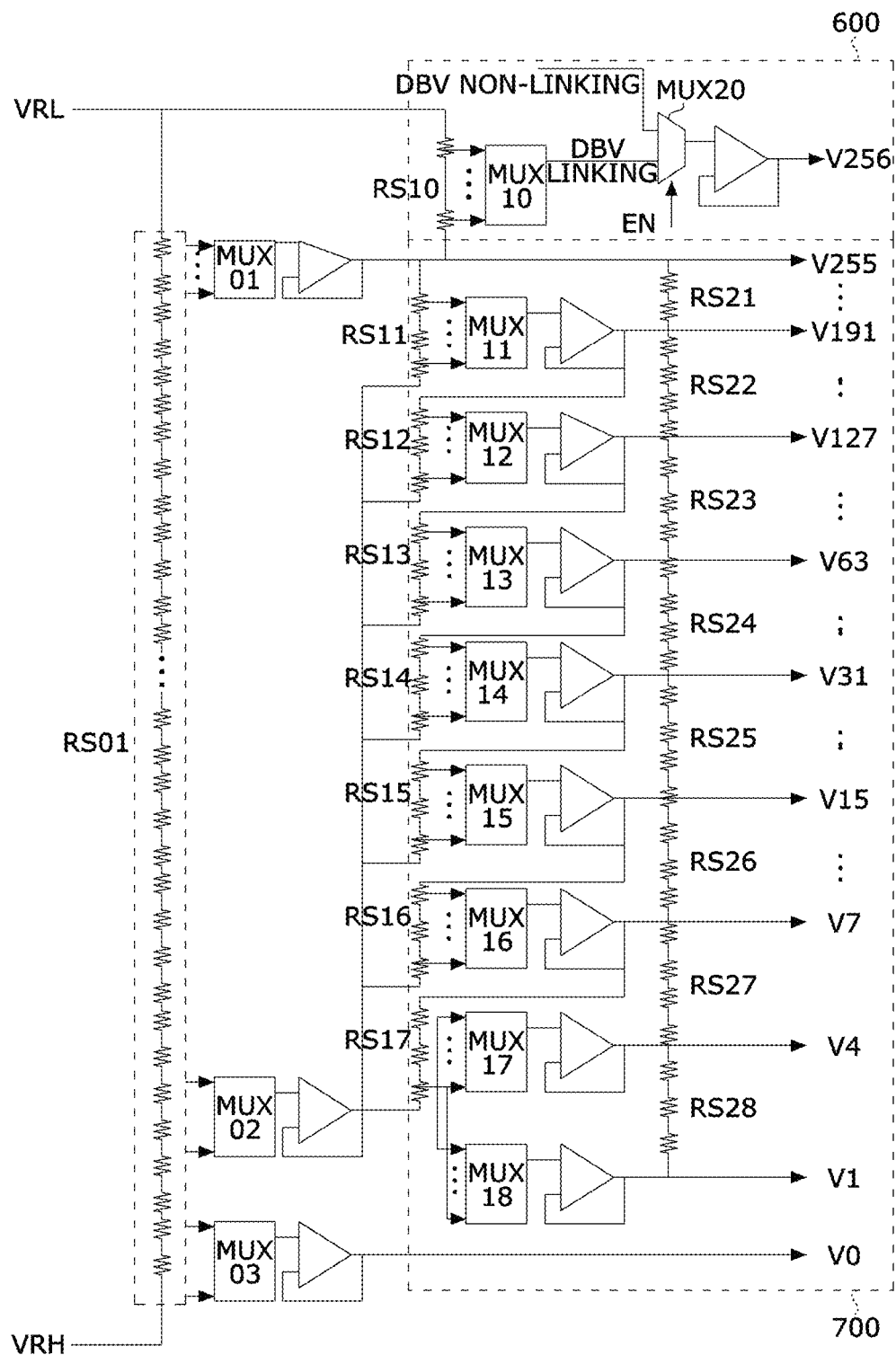
FIG. 26 is a circuit diagram illustrating a gamma compensation voltage generator according to one embodiment of the present disclosure.

FIG. 26 is a circuit diagram illustrating a gamma compensation voltage generator 305 according to one embodiment of the present disclosure.

Referring to FIG. 26, the gamma compensation voltage generator 305 receives a high potential input reference voltage VRH and a low potential input reference voltage VRL from a power supply 304 and outputs a gamma compensation voltage (or a display driving voltage) for each gradation for display driving and outputs a light source driving voltage. When the driving element DT of the pixel circuit is implemented as a p-channel TFT, as the gate voltage is decreased, an amount of a current is increased, and thus as a gamma compensation voltage output from the gamma compensation voltage generator 305 is decreased, the pixel and the light-emitting element OLED of the sensing light source may emit light at a high brightness.

The gamma compensation voltage generator 305 includes an input voltage selector, a gamma compensation voltage generator 700 for generating a gamma compensation voltage for display driving, and a light source driving voltage generator 600.

The gamma compensation voltage generator 305 includes a plurality of voltage divider circuits and a plurality of multiplexers. The voltage divider circuit divides a voltage between a high-potential voltage and a low-potential voltage using resistors connected in series and outputs voltages having different voltage levels. Each of the multiplexers selects a voltage indicated by a register setting value from among the voltages divided by the voltage divider circuit. The timing controller 303 may input register setting values in the display mode, the fingerprint recognition mode, and the capturing mode to control terminals of the multiplexers and control voltage levels of output voltages V0 to V256 of the gamma compensation voltage generator 305 for each mode. The register setting value may be defined and updated by register setting data stored in the second memory 302.

The input voltage selector includes a voltage divider circuit RS01, a multiplexer MUX01 for selecting a highest gradation voltage V255 according to a setting value of a first register, a multiplexer MUX02 for selecting lower gamma compensation voltages according to a setting value of a second register, and a multiplexer MUX03 for outputting a lowest gamma compensation voltage V0 according to a setting value of a third register. The voltage V255 output from the multiplexer MUX01 is supplied to the voltage divider circuits of the gamma compensation voltage generator 700 and the light source driving voltage generator 600. The voltage output from the multiplexer MUX02 is supplied to the voltage divider circuits of the gamma compensation voltage generator 700.

The light source driving voltage generator 600 includes a tenth voltage divider circuit RS10 and multiplexers MUX10 and MUX20, which are connected between a VRL node and a V255 node. The voltage divider circuit RS10 divides voltages between the low potential input reference voltage VRL and the highest gradation voltage V255. The output voltages of the voltage divider circuit RS10 have voltage levels that are higher than a voltage level of the highest gray level voltage V255. The multiplexer MUX10 selects any one among the voltages divided by the voltage divider circuit RS10 according to a setting value of a fourth register and outputs a light source driving voltage (a display brightness value (DBV) linking voltage) which is varied according to a DBV. The DBV is brightness setting data for varying brightness according to an output signal of an illumination sensor of the host system 200 or a brightness input value of a user. A register setting value, which controls each multiplexer, may be varied according to the DBV. The output voltages of the multiplexer MUX10 may be selected from a gradation voltage range that is higher than the highest gradation voltage V255. Thus, in the fingerprint recognition mode, since a voltage applied to the sensing light source SL of the first sensing area SA is a gradation voltage that is higher than the highest gradation voltage of the display mode, the sensing light source SL may emit light at a brightness that is higher than maximum brightness in the display mode.

The multiplexer MUX20 selects any one of a separate reference voltage (DBV non-linking voltage), which is independently set from the DBV, and the DBV linking voltage output from the multiplexer MUX10 under the control of the host system 200 and outputs a light source driving voltage V256. The DBV non-linking voltage is a gradation voltage that is higher than the highest gradation voltage V255. In the fingerprint recognition mode and the capturing mode, the host system 200 may control the output voltage of the multiplexer MUX20 using an enable signal EN. Thus, the DBV linking voltage or the DBV non-linking voltage, which is output from the multiplexer MUX20, is the light source driving voltage V256 capable of obtaining gradation brightness that is higher than gradation brightness of the highest gradation voltage V255.

The gamma compensation voltage generator 700 includes a plurality of voltage divider circuits RS11 to RS17 and a plurality of multiplexers MUX11 to MUX18.

A first-first voltage divider circuit R11 divides a voltage between an output voltage of the first multiplexer MUX01 and an output voltage of the second multiplexer MUX02. The first-first multiplexer MUX11 selects any one among voltages divided by the voltage divider circuit RS11 according to a register setting value. The output voltage of the first-first multiplexer MUX11 may be output through a buffer and may be a voltage V191 of 191 gradations. The first-second voltage divider circuit RS12 divides a voltage between the output voltage of the first-first multiplexer MUX11 and the output voltage of the second multiplexer MUX02. The first-second multiplexer MUX12 selects any one among voltages divided by the voltage divider circuit R12 according to a register setting value. The output voltage of the first-second multiplexer MUX12 may be output through a buffer and may be a voltage V127 of 127 gradations.

The first-third voltage divider circuit RS13 divides a voltage between the output voltage of the first-second multiplexer MUX12 and the output voltage of the second multiplexer MUX02. The first-third multiplexer MUX13 selects any one among voltages divided by the voltage divider circuit RS13 according to a register setting value. The output voltage of the first-third multiplexer MUX13 may be output through a buffer and may be a voltage V63 of 63 gradations. The first-fourth voltage divider circuit RS14 divides a voltage between the output voltage of the first-third multiplexer MUX13 and the output voltage of the second multiplexer MUX02. The first-fourth multiplexer MUX14 selects any one among voltages divided by the voltage divider circuit RS14 according to a register setting value. The output voltage of the first-fourth multiplexer MUX14 may be output through a buffer and may be a voltage V31 of 31 gradations.

The first-fifth voltage divider circuit RS15 divides a voltage between the output voltage of the first-fourth multiplexer MUX14 and the output voltage of the second multiplexer MUX02. The first-fifth multiplexer MUX15 selects any one among voltages divided by the voltage divider circuit RS15 according to a register setting value. The output voltage of the first-fifth multiplexer MUX15 may be output through a buffer and may be a voltage V15 of 15 gradations. The first-sixth voltage divider circuit RS16 divides a voltage between the output voltage of the first-fifth multiplexer MUX15 and the output voltage of the second multiplexer MUX02. The first-sixth multiplexer MUX16 selects any one among voltages divided by the voltage divider circuit RS16 according to a register setting value. The output voltage of the first-sixth multiplexer MUX16 may be output through a buffer and may be a voltage V7 of 7 gradations.

The first-seventh voltage divider circuit RS17 divides a voltage between the output voltage of the first-sixth multiplexer MUX16 and the output voltage of the second multiplexer MUX02. The first-seventh multiplexer MUX17 selects any one among voltages divided by the voltage divider circuit RS17 according to a register setting value. The output voltage of the first-seventh multiplexer MUX17 may be output through a buffer and may be a voltage V4 of 4 gradations. The first-eighth multiplexer MUX18 selects any one among voltages divided by the voltage divider circuit RS17 according to the register setting value. The output voltage of the first-eighth multiplexer MUX18 may be output through a buffer and may be a voltage V1 of 1 gradation.

The gamma compensation voltage generator 700 further includes a plurality of voltage divider circuits RS21 to RS28. The second-first voltage divider circuit RS21 divides a voltage between the highest gamma compensation voltage V255 and the voltage V191 of 191 gradations to output a gamma compensation voltage between the highest gradation and the 191 gradations. The second-second voltage divider circuit RS22 divides a voltage between the voltage V191 of 191 gradations and the voltage V127 of 127 gradations to output a gamma compensation voltage between the 191 gradations and the 127 gradations. The second-third voltage divider circuit RS23 divides a voltage between the voltage V127 of 127 gradations and the voltage V63 of 63 gradations to output a gamma compensation voltage between the 127 gradations and the 63 gradations. The second-fourth voltage divider circuit RS24 divides a voltage between the voltage V63 of 63 gradations and the voltage V31 of 31 gradations to output a gamma compensation voltage between the 63 gradations and the 31 gradations. The second-fifth voltage divider circuit RS25 divides a voltage between the voltage V31 of 31 gradations and the voltage V15 of 15 gradations to output a gamma compensation voltage between the 31 gradations and the 15 gradations. The second-sixth voltage divider circuit RS26 divides a voltage between the voltage V15 of 15 gradations and the voltage V7 of 7 gradations to output a gamma compensation voltage between the 15 gradations and the 7 gradations. The second-seventh voltage divider circuit RS27 divides a voltage between the voltage V7 of 7 gradations and the voltage V4 of 4 gradations to output a gamma compensation voltage between the 7 gradations and the 4 gradations. The second-eighth voltage divider circuit RS28 divides a voltage between the voltage V4 of 4 gradations and the voltage V1 of 1 gradation to output a gamma compensation voltage between the 4 gradations and the 1 gradation.

In order to output an optimal gamma compensation voltage for each of the R, G, and B sub-pixels, the gamma compensation voltage generator 305 may include an R gamma compensation voltage generator, a G gamma compensation voltage generator, and a B gamma compensation voltage generator. In this case, register setting values may be set to different voltages in the R gamma compensation voltage generator, the G gamma compensation voltage generator, and the B gamma compensation voltage generator. Gamma compensation voltages output from the R gamma compensation voltage generator are data voltages of gradations to be supplied to the R sub-pixel. Gamma compensation voltages V0 to V255 output from the G gamma compensation voltage generator are data voltages of gradations to be supplied to the G sub-pixel. Gamma compensation voltages output from the B gamma compensation voltage generator are data voltages of gradations to be supplied to the B sub-pixel.

The gamma compensation voltages V0 to V255 of gradations and the light source driving voltage V256 are input to the DAC of the data driver 306. The DAC of the data driver 306 converts the pixel data received from the timing controller 303 into different gamma compensation voltages for each gradation to generate the data voltage Vdata for display driving. In the fingerprint recognition mode, the data driver 306 converts the light source driving data received from the timing controller 303 into the light source driving voltage V256 and supplies the light source driving voltage V256 to sub-pixels in the sensing area, which are used as light sources, through the data lines.

Since the PPI of each of the sensing areas SA and CA is lower than the PPI of the display area DA, when the pixels of the display area DA and the pixels of the sensing areas SA and CA are driven at the same data voltage in the same gradation, brightness of the sensing areas SA and CA may be decreased. According to the present disclosure, the register setting values of the gamma compensation voltage generator 305 are varied in the fingerprint sensing mode or the capturing mode. Thus, in the fingerprint sensing mode or the capturing mode, a range of data voltages applied to the pixels of the sensing areas SA and CA is extended so that brightness of the pixels in the sensing areas SA and CA may be increased.

FIG. 27 is a diagram illustrating data voltages applied to the pixels in the display area and data voltages applied to the pixels in the sensing area. In FIG. 27, a "PGMA Range" indicates an output voltage range of the gamma compensation voltage generator 305.

Referring to FIG. 27, since the PPI of the sensing areas SA and CA is low, the data driver 306 expands a range of the data voltage Vdata applied to the pixels of the sensing areas SA and CA more than a range of the data voltage Vdata applied to the pixels of the display area DC.

In accordance with the present disclosure, photosensors for fingerprint sensing are embedded in a display panel together with pixels. In accordance with the present disclosure, a pixel drive circuit and a photosensor drive circuit share power lines and signal lines, and electrodes of a light-emitting element and a photodiode are disposed on the same layer so that a structure of the display panel can be simplified. In addition, in accordance with the present disclosure, light sources can be additionally disposed so as to obtain a good fingerprint image in a sensing area having low pixels per inch (PPI). Consequently, in accordance with the present disclosure, a process of assembling the display panel with a fingerprint sensor module is not required, and image quality and fingerprint sensing performance of a fingerprint sensing area can be improved. As the PPI of the sensing area is decreased, the number of light sources disposed in the sensing area can be increased.

In accordance with the present disclosure, fingerprint pattern images are repeatedly sensed while brightness of a light source is varied in the sensing area, and fingerprint authentication is performed on the basis of a fingerprint pattern image having high sharpness among the fingerprint pattern images so that accuracy of fingerprint recognition can be increased.

In accordance with the present disclosure, brightness of pixels used as light sources is controlled to be higher in a sensing area having low PPI than brightness of the pixels in a display area so that degradation of brightness of the sensing area can be compensated for.

Effects which can be achieved by the present disclosure are not limited to the above-mentioned effects. That is, other objects that are not mentioned may be obviously understood by those skilled in the art to which the present disclosure pertains from the above description.

The objects to be achieved by the present disclosure, the means for achieving the objects, and effects of the present disclosure described above do not specify essential features of the claims, and thus, the scope of the claims is not limited to the disclosure of the present disclosure.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
a display panel including a display area in which a plurality of pixels are disposed and a sensing area in which a plurality of photosensors, one or more sensing light sources, and a plurality of pixel groups are disposed,
wherein each of the pixel groups includes one or two pixels; and
each pixel of the plurality of pixel groups includes two to four sub-pixels,
wherein the plurality of pixels of the display area and the pixel groups of the sensing area emit light by receiving a data voltage of an input image in a display mode, and
at least some sub-pixels of the pixel groups in the sensing area emit light in a fingerprint recognition mode,
wherein the one or more sensing light sources include at least one sub-pixel which is turned on to emit light in the fingerprint recognition mode and is turned off in the display mode,
wherein the one or more sensing light sources and one or more photosensors of the plurality of photosensors are disposed between adjacent pixel groups from the plurality of pixel groups.

2. The display device of claim 1, wherein:
distances between adjacent photosensors from the plurality of photosensors in the sensing area are the same;
distances between adjacent sensing light sources from the one or more sensing light sources in the sensing area are the same;
in the sensing area, the distances between the adjacent photosensors is equal to the distances between the adjacent sensing light sources; and
distances between the adjacent pixel groups in the sensing area are the same.

3. The display device of claim 1, wherein:
each of the one or more sensing light sources includes a green sub-pixel; and
in the fingerprint recognition mode, the green sub-pixel of each of the one or more sensing light sources and all sub-pixels of the pixel groups are turned on.

4. The display device of claim 1, wherein:
each of the one or more sensing light sources includes a green sub-pixel; and
in the fingerprint recognition mode, the green sub-pixel of each of the one or more sensing light sources and blue sub-pixels of all sub-pixels of the pixel groups are turned on.

5. The display device of claim 1, wherein:
each of the one or more sensing light sources includes a green sub-pixel; and
in the fingerprint recognition mode, only the green sub-pixel of each of the one or more sensing light sources is turned on among the sub-pixels of the sensing area.

6. The display device of claim 2, wherein, as pixels per inch (PPI) of the sensing area is decreased, a number of the one or more sensing light sources is increased.

7. The display device of claim 1, wherein:
a light-emitting element of a pixel includes an organic light-emitting diode (OLED);
a photosensor from the plurality of photosensors includes an inorganic photodiode;
an insulating layer is disposed between a cathode electrode of the OLED and an anode electrode of the inorganic photodiode; and
the OLED is electrically separated from the inorganic photodiode.

8. The display device of claim 7, wherein the anode electrode of the OLED is coplanar with the cathode electrode of the inorganic photodiode.

9. The display device of claim 1, further comprising a fingerprint recognition processor configured to receiving a signal, which is photoelectrically converted by a photosensor from the one or more photosensors, and generate fingerprint pattern image data,
wherein the fingerprint recognition processor stores a plurality of fingerprint pattern images while varying a number of the one or more sensing light sources turned on in the fingerprint recognition mode and selects an image having highest sharpness among the fingerprint pattern images as an image to be used for fingerprint authentication.

10. The display device of claim 1, further comprising:
a data driver configured to convert received digital data into a gamma compensation voltage using a digital-to-analog converter (DAC) and output a data voltage to be applied to the pixels; and
a gamma compensation voltage generator which supplies the gamma compensation voltage to the DAC.

11. The display device of claim 10, wherein:
the gamma compensation voltage generator outputs a gamma compensation voltage for each gradation of the pixel data and outputs a gradation voltage that is higher than the gamma compensation voltage for each gradation as a light source driving voltage;
the data driver converts the light source driving data received in the fingerprint recognition mode into the light source driving voltage; and
the light source driving voltage is supplied to sub-pixels of the plurality of pixel groups turned on in the fingerprint recognition mode.

12. A display device comprising:
a display panel including a display area in which a first plurality of pixels are disposed and a sensing area in which a plurality of photosensors and a second plurality of pixels are disposed,
wherein the first plurality of pixels of the display area and the second plurality of pixels of the sensing area emit light by receiving a data voltage of an input image in a display mode, and
at least some of the second plurality of pixels in the sensing area emit light in a fingerprint recognition mode, wherein:
a light-emitting element of a pixel includes an organic light-emitting diode (OLED);
a photosensor from the plurality of photosensors includes an organic photodiode;
an anode electrode of the OLED is coplanar with an anode electrode of the organic photodiode;
a cathode electrode of the OLED is coplanar with a cathode electrode of the organic photodiode; and
a pixel drive circuit configured to drive the OLED and a photosensor drive circuit configured to drive the organic photodiode share one or more lines.

13. A mobile terminal device comprising:
a display panel including a display area in which a plurality of pixels are disposed and a sensing area in which a plurality of photosensors, one or more sensing light sources, and a plurality of pixel groups are disposed; and
a fingerprint recognition processor configured to generate fingerprint pattern image data from a signal which is photoelectrically converted by a photosensor in the sensing area,
wherein each of the pixel groups includes one or two pixels; and
each pixel of the plurality of pixel groups includes two to four sub-pixels,
wherein the plurality of pixels of the display area and the pixel groups of the sensing area emit light by receiving a data voltage of an input image in a display mode, and
at least some sub-pixels of the pixel groups in the sensing area emit light in a fingerprint recognition mode,
wherein the one or more sensing light sources include at least one sub-pixel which is turned on to emit light in the fingerprint recognition mode and is turned off in the display mode,
wherein the one or more sensing light sources and one or more photosensors of the plurality of photosensors are disposed between adjacent pixel groups from the plurality of pixel groups.

14. The mobile terminal device of claim 13, wherein:
distances between adjacent photosensors from the plurality of photosensors in the sensing area are the same;
distances between adjacent sensing light sources from the one or more sensing light sources in the sensing area are the same; and
distances between the adjacent pixel groups in the sensing area are the same.

15. The mobile terminal device of claim 13, wherein the fingerprint recognition processor stores a plurality of fingerprint pattern images while varying a number of the one or more sensing light sources turned on in the fingerprint recognition mode and selects an image having highest sharpness among the fingerprint pattern images as an image to be used for fingerprint authentication.

* * * * *